(12) United States Patent
Kagan et al.

(10) Patent No.: US 10,474,591 B2
(45) Date of Patent: Nov. 12, 2019

(54) ELECTRONIC METER WITH A REMOVABLE PROTECTIVE PLUG

(71) Applicant: Electro Industries/GaugeTech, Westbury, NY (US)

(72) Inventors: Erran Kagan, Great Neck, NY (US); Tibor Banhegyesi, Bladwin, NY (US); Avi Cohen, Great Neck, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 0 days.

(21) Appl. No.: 15/921,308

(22) Filed: Mar. 14, 2018

(65) Prior Publication Data
US 2018/0225231 A1    Aug. 9, 2018

Related U.S. Application Data

(63) Continuation of application No. 13/834,737, filed on Mar. 15, 2013, now abandoned, which is a
(Continued)

(51) Int. Cl.
*G06F 13/12* (2006.01)
*G01R 19/25* (2006.01)
(Continued)

(52) U.S. Cl.
CPC ............ *G06F 13/12* (2013.01); *G01D 4/002* (2013.01); *G01R 19/2513* (2013.01);
(Continued)

(58) Field of Classification Search
CPC .... G06F 13/12; G01D 4/002; G01R 19/2513; G01R 22/063; Y02B 90/241; Y04S 20/32
See application file for complete search history.

(56) References Cited

U.S. PATENT DOCUMENTS

D56,045 S    8/1920  White
D76,149 S    2/1924  Olsen
(Continued)

FOREIGN PATENT DOCUMENTS

JP    07235881    5/1995

OTHER PUBLICATIONS

Anderson, D., USB System Architecture, Nov. 2000, Addison-Wesley Professional, 9th Printing, pp. 22-23.
(Continued)

*Primary Examiner* — Henry Tsai
*Assistant Examiner* — John B Roche
(74) *Attorney, Agent, or Firm* — Gerald E. Hespos; Michael J. Porco; Matthew T. Hespos

(57) ABSTRACT

An intelligent electronic device (IED), e.g., an electrical power meter, having at least one removable memory device for storing data sensed and generated by the intelligent electronic device is provided. The IED includes a housing; at least one sensor; at least one analog-to-digital converter; at least one processing unit coupled to the at least one analog-to-digital converter configured to receive the digital data and store the digital data in a removable memory; and at least one device controller coupled to the at least one processing unit, the at least one device controller including an interface disposed on the housing for interfacing with the removable memory, wherein the at least one device controller is operative as a USB master or USB slave device controller.

24 Claims, 18 Drawing Sheets

Related U.S. Application Data continuation-in-part of application No. 12/628,636, filed on Dec. 1, 2009, now Pat. No. 9,885,739.

(51) Int. Cl.
  *G01D 4/00* (2006.01)
  *G01R 22/06* (2006.01)

(52) U.S. Cl.
  CPC .......... *G01R 22/063* (2013.01); *Y02B 90/241* (2013.01); *Y04S 20/32* (2013.01)

(56) References Cited

U.S. PATENT DOCUMENTS

| | | | |
|---|---|---|---|
| 1,705,301 A | 3/1929 | Miller | |
| D187,740 S | 4/1960 | Littlejohn | |
| D199,808 S | 12/1964 | Gazzman, III | |
| D201,100 S | 5/1965 | Little et al. | |
| D241,006 S | 8/1976 | Wallace | |
| 3,989,334 A | 11/1976 | Fortino | |
| D273,574 S | 4/1984 | Overs | |
| 4,609,247 A | 9/1986 | Annoot | |
| 5,014,213 A | 5/1991 | Edwards et al. | |
| D332,923 S | 2/1993 | Polydoris et al. | |
| D343,786 S | 2/1994 | Hines et al. | |
| D348,019 S | 6/1994 | Kocol et al. | |
| 5,459,850 A | 10/1995 | Clay et al. | |
| 5,475,693 A | 12/1995 | Christopherson et al. | |
| D366,434 S | 1/1996 | Brown et al. | |
| 5,485,595 A | 1/1996 | Assar et al. | |
| 5,581,470 A | 12/1996 | Pawloski | |
| 5,598,370 A | 1/1997 | Niijima et al. | |
| 5,634,050 A | 5/1997 | Krueger et al. | |
| 5,640,529 A | 6/1997 | Hasbun | |
| 5,650,936 A | 7/1997 | Loucks et al. | |
| 5,736,847 A | 4/1998 | Doorn et al. | |
| 5,787,445 A | 7/1998 | Daberko | |
| 5,828,576 A | 10/1998 | Loucks et al. | |
| 5,841,269 A | 11/1998 | Schoonmaker et al. | |
| 5,897,661 A | 4/1999 | Baranovsky et al. | |
| 5,995,911 A | 11/1999 | Hart | |
| 6,000,034 A | 12/1999 | Lightbody et al. | |
| 6,007,353 A | 12/1999 | Webster | |
| D427,533 S | 7/2000 | Cowan et al. | |
| D429,655 S | 8/2000 | Cowan et al. | |
| D435,471 S | 12/2000 | Simbeck et al. | |
| 6,183,274 B1 | 2/2001 | Allum | |
| 6,185,508 B1 | 2/2001 | Van Doom et al. | |
| 6,186,842 B1 | 2/2001 | Hirschbold et al. | |
| D439,535 S | 3/2001 | Cowan et al. | |
| 6,236,949 B1 | 5/2001 | Hart | |
| D443,541 S | 6/2001 | Hancock et al. | |
| 6,256,762 B1 | 7/2001 | Beppu | |
| D455,066 S | 4/2002 | Kolinen | |
| 6,384,946 B1 | 5/2002 | Pitsch et al. | |
| 6,397,155 B1 | 5/2002 | Przydatek et al. | |
| D458,863 S | 6/2002 | Harding et al. | |
| D459,259 S | 6/2002 | Harding et al. | |
| 6,466,434 B1 | 10/2002 | Tsai | |
| 6,476,595 B1 | 11/2002 | Heuell et al. | |
| 6,476,729 B1 | 11/2002 | Liu | |
| 6,493,644 B1 | 12/2002 | Jonker et al. | |
| 6,513,091 B1 | 1/2003 | Blackmon et al. | |
| 6,563,697 B1 | 5/2003 | Simbeck et al. | |
| 6,611,773 B2 | 8/2003 | Przydatek et al. | |
| 6,611,922 B2 | 8/2003 | Ozcetin et al. | |
| 6,615,147 B1 | 9/2003 | Jonker et al. | |
| 6,636,030 B1 | 10/2003 | Rose et al. | |
| 6,654,842 B1 | 11/2003 | Park | |
| 6,671,635 B1 | 12/2003 | Forth et al. | |
| 6,671,654 B1 | 12/2003 | Forth et al. | |
| 6,687,627 B1 | 2/2004 | Gunn et al. | |
| 6,694,270 B2 | 2/2004 | Hart | |
| 6,735,535 B1 | 5/2004 | Kagan et al. | |
| 6,737,855 B2 | 5/2004 | Huber et al. | |
| 6,745,138 B2 | 6/2004 | Przydatek et al. | |
| 6,751,562 B1 | 6/2004 | Blackett et al. | |
| 6,751,563 B2 | 6/2004 | Spanier et al. | |
| 6,792,337 B2 | 9/2004 | Blackett et al. | |
| 6,792,364 B2 | 9/2004 | Jonker et al. | |
| 6,798,190 B2 | 9/2004 | Harding et al. | |
| 6,798,191 B1 | 9/2004 | Macfarlane et al. | |
| 6,813,571 B2 | 11/2004 | Lightbody et al. | |
| 6,825,776 B2 | 11/2004 | Lightbody et al. | |
| 6,853,978 B2 | 2/2005 | Forth et al. | |
| 6,871,150 B2 | 3/2005 | Huber et al. | |
| D505,087 S | 5/2005 | Ricci et al. | |
| 6,944,555 B2 | 9/2005 | Blackett et al. | |
| 6,957,158 B1 | 10/2005 | Hancock et al. | |
| 6,961,641 B1 | 11/2005 | Forth et al. | |
| 6,983,211 B2 | 1/2006 | Cowan et al. | |
| 6,988,025 B2 | 1/2006 | Ransom et al. | |
| 6,988,182 B2 | 1/2006 | Teachman et al. | |
| 6,990,395 B2 | 1/2006 | Ransom et al. | |
| 7,006,934 B2 | 2/2006 | Jonker et al. | |
| 7,010,438 B2 | 3/2006 | Hancock et al. | |
| 7,072,779 B2 | 7/2006 | Hancock et al. | |
| D525,893 S | 8/2006 | Kagan et al. | |
| D526,920 S | 8/2006 | Kagan et al. | |
| 7,085,824 B2 | 8/2006 | Forth et al. | |
| 7,089,089 B2 | 8/2006 | Cumming et al. | |
| 7,096,316 B1 | 8/2006 | Karr et al. | |
| 7,127,328 B2 | 10/2006 | Ransom | |
| D532,747 S | 11/2006 | Ricci et al. | |
| 7,136,384 B1 | 11/2006 | Wang | |
| D534,120 S | 12/2006 | Ricci et al. | |
| 7,155,350 B2 | 12/2006 | Kagan | |
| 7,158,050 B2 | 1/2007 | Lightbody et al. | |
| 7,174,258 B2 | 2/2007 | Hart | |
| 7,174,261 B2 | 2/2007 | Gunn et al. | |
| 7,184,904 B2 | 2/2007 | Kagan | |
| 7,188,003 B2 | 3/2007 | Ransom et al. | |
| 7,191,076 B2 | 3/2007 | Huber et al. | |
| 7,216,043 B2 | 5/2007 | Ransom et al. | |
| D545,181 S | 6/2007 | Kagan et al. | |
| 7,246,014 B2 | 7/2007 | Forth et al. | |
| 7,248,977 B2 | 7/2007 | Hart | |
| 7,248,978 B2 | 7/2007 | Ransom | |
| 7,249,265 B2 | 7/2007 | Carolsfeld et al. | |
| 7,256,709 B2 | 8/2007 | Kagan | |
| 7,271,996 B2 | 9/2007 | Kagan et al. | |
| 7,294,997 B2 | 11/2007 | Kagan | |
| 7,304,586 B2 | 12/2007 | Wang et al. | |
| 7,305,310 B2 | 12/2007 | Slota et al. | |
| 7,337,081 B1 | 2/2008 | Kagan | |
| 7,417,419 B2 | 8/2008 | Tate | |
| 7,472,138 B2 | 12/2008 | Adkins et al. | |
| D615,895 S | 5/2010 | Beattie | |
| 7,868,782 B2 | 1/2011 | Ehrke et al. | |
| D642,083 S | 7/2011 | Blanc et al. | |
| D653,572 S | 2/2012 | Ohtani et al. | |
| 8,176,174 B2 | 5/2012 | Kagan | |
| D666,933 S | 9/2012 | Hoffman et al. | |
| 8,310,403 B2 | 11/2012 | Nahar | |
| 8,325,057 B2 | 12/2012 | Salter | |
| 8,365,960 B1* | 2/2013 | Kalaouze | B65D 81/3211 206/221 |
| D682,720 S | 5/2013 | Kagan et al. | |
| D682,721 S | 5/2013 | Kagan et al. | |
| 8,587,949 B2 | 11/2013 | Banhegyesi et al. | |
| D712,289 S | 9/2014 | Kagan et al. | |
| D712,290 S | 9/2014 | Kagan et al. | |
| D712,291 S | 9/2014 | Kagan et al. | |
| 8,947,246 B2 | 2/2015 | Aiken | |
| 9,063,181 B2 | 6/2015 | Banker | |
| D739,283 S | 9/2015 | Kagan | |
| 9,885,739 B2 | 2/2018 | Kagan | |
| 2001/0027500 A1 | 10/2001 | Matsunaga | |
| 2002/0051466 A1 | 5/2002 | Bruckman | |
| 2002/0114326 A1 | 8/2002 | Mahalingaiah | |
| 2002/0162014 A1* | 10/2002 | Przydatek | G01D 4/004 726/36 |
| 2002/0165677 A1 | 11/2002 | Lightbody et al. | |
| 2002/0166022 A1 | 11/2002 | Suzuki | |

(56) References Cited

U.S. PATENT DOCUMENTS

| | | |
|---|---|---|
| 2002/0188814 A1 | 12/2002 | Saito et al. |
| 2003/0003908 A1 | 1/2003 | McGrew et al. |
| 2003/0014200 A1 | 1/2003 | Jonker et al. |
| 2003/0065459 A1 | 4/2003 | Huber et al. |
| 2003/0066311 A1 | 4/2003 | Li et al. |
| 2003/0101008 A1 | 5/2003 | Hart |
| 2003/0105608 A1 | 6/2003 | Hart |
| 2003/0132742 A1 | 7/2003 | Harding et al. |
| 2003/0154471 A1 | 8/2003 | Teachman et al. |
| 2003/0175025 A1 | 9/2003 | Watanabe et al. |
| 2003/0210699 A1 | 11/2003 | Holt et al. |
| 2003/0212512 A1 | 11/2003 | Hart |
| 2003/0220752 A1 | 11/2003 | Hart |
| 2004/0028041 A1 | 2/2004 | Yasue |
| 2004/0066311 A1 | 4/2004 | Giles et al. |
| 2004/0138786 A1 | 7/2004 | Blackett et al. |
| 2004/0138787 A1 | 7/2004 | Ransom et al. |
| 2004/0138835 A1 | 7/2004 | Ransom et al. |
| 2004/0172207 A1 | 9/2004 | Hancock et al. |
| 2004/0183522 A1 | 9/2004 | Gunn et al. |
| 2004/0193329 A1 | 9/2004 | Ransom et al. |
| 2004/0229578 A1 | 11/2004 | Lightbody et al. |
| 2005/0017874 A1 | 1/2005 | Lightbody et al. |
| 2005/0027464 A1 | 2/2005 | Jonker et al. |
| 2005/0071106 A1 | 3/2005 | Huber et al. |
| 2005/0273281 A1 | 12/2005 | Wall et al. |
| 2005/0275397 A1 | 12/2005 | Lightbody et al. |
| 2005/0281105 A1 | 12/2005 | Oshima |
| 2005/0288876 A1 | 12/2005 | Doig et al. |
| 2005/0288877 A1 | 12/2005 | Doig et al. |
| 2006/0039196 A1 | 2/2006 | Gorobets et al. |
| 2006/0052958 A1 | 3/2006 | Hancock et al. |
| 2006/0070416 A1 | 4/2006 | Teratani |
| 2006/0071813 A1 | 4/2006 | Kagan |
| 2006/0076944 A1* | 4/2006 | Weikel ............... G01R 21/133 324/74 |
| 2006/0077999 A1 | 4/2006 | Kagan et al. |
| 2006/0086893 A1 | 4/2006 | Spanier et al. |
| 2006/0106972 A1 | 5/2006 | Gorobets et al. |
| 2006/0133454 A1 | 6/2006 | Beckwith |
| 2006/0161400 A1 | 7/2006 | Kagan |
| 2006/0170409 A1 | 8/2006 | Kagan et al. |
| 2006/0230394 A1 | 10/2006 | Forth et al. |
| 2006/0271244 A1 | 11/2006 | Cumming et al. |
| 2007/0033151 A1* | 2/2007 | Lee, Jr. ............ G01R 19/2513 705/412 |
| 2007/0055889 A1 | 3/2007 | Henneberry et al. |
| 2007/0067119 A1* | 3/2007 | Loewen ............... G01R 22/06 702/57 |
| 2007/0067121 A1 | 3/2007 | Przydatek et al. |
| 2007/0114054 A1 | 5/2007 | Mon |
| 2007/0136010 A1 | 6/2007 | Gunn et al. |
| 2007/0150214 A1 | 6/2007 | Qin et al. |
| 2007/0165365 A1* | 7/2007 | Kamiya ............... H01R 13/447 361/600 |
| 2008/0046205 A1 | 2/2008 | Gilbert et al. |
| 2008/0065335 A1 | 3/2008 | Doig et al. |
| 2008/0263245 A1 | 10/2008 | Hsieh |
| 2009/0011738 A1 | 1/2009 | Sasakura |
| 2009/0140880 A1* | 6/2009 | Flen .................... H04B 3/54 340/870.02 |
| 2009/0182921 A1 | 7/2009 | Lin et al. |
| 2010/0289457 A1 | 11/2010 | Onnerud et al. |
| 2012/0314354 A1 | 12/2012 | Rayner |
| 2013/0297840 A1 | 11/2013 | Kagan et al. |

OTHER PUBLICATIONS

BE1-951 Multifunction Protection System, Basler Electric, Sep. 2012 pp. 1-12.

IEEE Standard Common Format for Transient Data Exchange, Oct. 15, 1999, IEEE.

Jemstar High Accuracy Revenue Meter for Generation, Transmission, and Industrial Power Measurement, Ametek Power Instruments, 2012, pp. 1-2.

Jemstar Retrofit for Generation, Transmission, and Industrial Power Measurement, Ametek Power Instruments, 2007, pp. 1-2.

Mark-V EMS60 Intelligent Energy Meter, Advanced High-Accuracy Meter With Integrated Data Telemetry Solutions and Power Quality Monitoring, Transdata Energy Metering and Automation, 2010, pp. 1-2.

Nexus 1262/1272 High Performance Utility Billing Meters With Communication & Advanced Power Quality, Electro Industries/Gaugetech, 062112 pp. 1-12.

Nexus 1262/1272 Switchboard Meter Quick Start, Electro Industries-Gaugetech, 083112, pp. 1-4.

Power Quality Standards Coordinating Committee, IEEE P1159.3/D9 Draft: Recommended Practice for the Transfer of Power Quality Data, Aug. 1, 2002, IEEE Standards Activities Department.

Powerlogic ION8650, Schneider Electric, 2011, pp. 1-12.

The Authoritative Dictionary of IEEE Standards Terms, Seventh Edition, IEEE Std 100-2000 , Published 2000, p. 574.

Xu Hong, Wang Jianhua, "An Extendable Data Engine based on OPC Specification"; Computer Standards & Interfaces 26 (2004) 515-525; Dec. 5, 2003.

* cited by examiner

```
Time of Use Report for Device: 0123456789ABCDEF   Serial Number:
5000000000000014
Prepared on:   , October 29, 2009 at 14:48:57
Group:   , Frozen
Averaging:   , Block Window
From:   , 10/01/2009 00:00:00.09 ,  To  , 10/01/2009 23:59:59.00
R1: On-Peak
Register Accumulations
Quadrant 1 + 4 Watthour , 000000000 k
Quadrant 1       VAhour  , 00.0000000 M
Quadrant 1       VARhour , 00.0000000 M
Quadrant 4       VAhour  , 00.0000000 M
Quadrant 4       VARhour , 00.0000000 M
Quadrant 2 + 3 Watthour , 000000000 k
Quadrant 2       VAhour  , 00.0000000 M
Quadrant 2       VARhour , 00.0000000 M
Quadrant 3       VAhour  , 00.0000000 M
Quadrant 3       VARhour , 00.0000000 M
Demand   ,   , Time Stamp
Quadrant 1 + 4 Watt , 0.00 , 10/01/2009 00:00:00.11
Quadrant 2 + 3 Watt , 0.00 , 10/01/2009 00:00:00.11
Quadrant 1 + 2 VAR  , 0.00 , 10/01/2009 00:00:00.11
Quadrant 3 + 4 VAR  , 0.00 , 10/01/2009 00:00:00.11
Quadrant 1 + 4 Coincident VAR , 0.00 ,
Quadrant 2 + 3 Coincident VAR , 0.00 , R2: Off-Peak
Register Accumulations
Quadrant 1 + 4 Watthour , 000000000 k
Quadrant 1       VAhour  , 00.0000000 M
Quadrant 1       VARhour , 00.0000000 M
Quadrant 4       VAhour  , 00.0000000 M
Quadrant 4       VARhour , 00.0000000 M
Quadrant 2 + 3 Watthour , 000000000 k
Quadrant 2       VAhour  , 00.0000000 M
Quadrant 2       VARhour , 00.0000000 M
Quadrant 3       VAhour  , 00.0000000 M
Quadrant 3       VARhour , 00.0000000 M
Demand   ,   , Time Stamp
Quadrant 1 + 4 Watt , 0.00 , 10/01/2009 00:00:00.11
Quadrant 2 + 3 Watt , 0.00 , 10/01/2009 00:00:00.11
Quadrant 1 + 2 VAR  , 0.00 , 10/01/2009 00:00:00.11
Quadrant 3 + 4 VAR  , 0.00 , 10/01/2009 00:00:00.11
Quadrant 1 + 4 Coincident VAR , 0.00 ,
Quadrant 2 + 3 Coincident VAR , 0.00 ,
```

FIG. 4

ELECTRONIC METER WITH A REMOVABLE PROTECTIVE PLUG

This application is a continuation application of U.S. application Ser. No. 13/834,737, filed on Mar. 15, 2016, which is a continuation-in-part application of U.S. application Ser. No. 12/628,636 filed on Dec. 1, 2009, now U.S. Pat. No. 9,885,739, the contents of which are hereby incorporated by reference in their entireties.

BACKGROUND

1. Field

The present disclosure relates generally to intelligent electronic devices (IEDs) for electrical power systems, and more particularly, to an IED including a removable device for storing data relating to electrical power distribution systems.

2. Description of the Related Art

Electric utility companies ("utilities") track electric usage by customers by using power meters. These meters track the amount of power consumed at a particular location. These locations range from power substations, to commercial businesses, to residential homes. The electric utility companies use information obtained from the power meter to charge their customers for their power consumption, i.e., revenue metering.

A popular type of power meter is the socket-type power meter, i.e., S-base or Type S meter. As its name implies, the meter itself plugs into a socket for easy installation, removal and replacement. Other meter installations include panel mounted, switchboard mounted, and circuit breaker mounted. Typically, the power meter connects between utility power lines supplying electricity and a usage point, namely, a residence or commercial place of business.

A power meter may also be placed at a point within the utility's power grid to monitor power flowing through that point for distribution, power loss, or capacity monitoring, e.g., at a substation. These power and energy meters are installed in substations to provide a visual display of real-time data and to alarm when problems occur. These problems include limit alarms, breaker control, outages and many other types of events.

In today's times, users are interested in capturing data in an intelligent electronic device (IED) and taking that data back to an office and analyzing or databasing the data at a later time. The common way to gather data in the art now is to download stored data via a communication port to a laptop or a stationary computing device utilizing a serial or Ethernet protocol. The disadvantage of this technology is that the user doesn't always have a laptop available and there is a latency time to gathering the data due to the protocol communication. For instance, to download 2 megabytes of data using traditional serial download schemes could take as long as 10 minutes.

Therefore, a need exists for devices, systems and methods for storing data sensed and generated by an intelligent electronic device (IED), e.g., a power meter, and for managing the stored data to extend the useful life of the meter.

SUMMARY

An intelligent electronic device (IED), e.g., an electrical power meter, having at least one removable memory device for storing data sensed and generated by the intelligent electronic device is provided. Utilizing the techniques of the present disclosure, a user will be able to just remove the portable or removable memory device and replace it with a fresh one and then download the data from the removable memory device to a computing device at a later period. In one embodiment, the IED will utilize a USB (Universal Serial Bus) architecture for communicating generated data to the removable memory device.

In one aspect of the present disclosure, an IED is configured to operate as a USB master and/or USB slave device. The USB master configuration for the IED can be implemented using both hardware and software both internally to the host IED processor or by an additional processor or processors or other type of silicon coupled to the IED processor either directly or indirectly. Moreover, the USB interface may also be allowed to be used as a USB slave wherein under user control or wherein the IED itself via its processor or other components stored internally can determine whether it chooses to be a USB master or USB slave device.

It is to be appreciated that the IED can be configured to have the interface act as a Ethernet or RS-232 device or any other type of communication architecture.

According to one aspect of the present disclosure, an intelligent electronic device (IED) is provided including a housing; at least one sensor configured for sensing at least one electrical parameter distributed to a load; at least one analog-to-digital converter coupled to the at least one sensor and configured for converting an analog signal output from the at least one sensor to a digital data; at least one processing unit coupled to the at least one analog-to-digital converter configured to receive the digital data and store the digital data in a removable memory; and at least one device controller coupled to the at least one processing unit, the at least one device controller including at least one interface disposed on the housing for interfacing with the removable memory, wherein the at least one device controller is operative as a master or slave device controller.

In one aspect, the at least one device controller operates in accordance with a Universal Serial Bus (USB) specification.

BRIEF DESCRIPTION OF THE DRAWINGS

The above and other aspects, features, and advantages of the present disclosure will become more apparent in light of the following detailed description when taken in conjunction with the accompanying drawings in which:

FIG. 4 is exemplary data in CSV format generated by an IED in accordance with an embodiment of the present disclosure;

DETAILED DESCRIPTION

Figure 1:
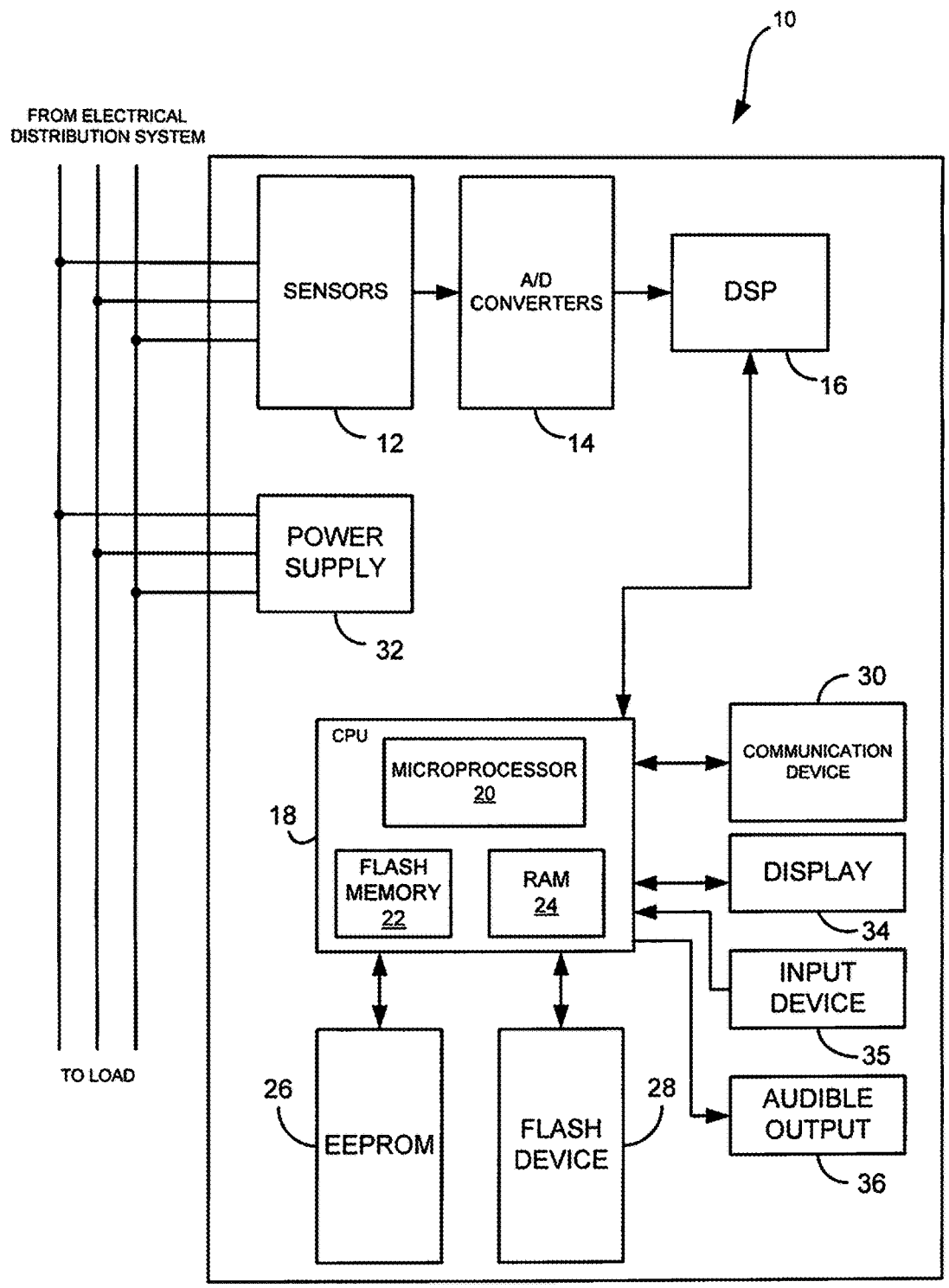
FIG. 1 is a diagram of an intelligent electronic device in accordance with an embodiment of the present disclosure.

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces.

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudo-code, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

The word "exemplary" is used herein to mean "serving as an example, instance, or illustration." Any configuration or design described herein as "exemplary" is not necessarily to be construed as preferred or advantageous over other configurations or designs. Herein, the phrase "coupled with" is defined to mean directly connected to or indirectly connected with through one or more intermediate components. Such intermediate components may include both hardware and software based components.

As used herein, intelligent electronic devices ("IED's") include Programmable Logic Controllers ("PLC's"), Remote Terminal Units ("RTU's"), electric power meters, protective relays, fault recorders and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power which they are metering.

An intelligent electronic device (IED) 10 for monitoring and determining an amount of electrical power usage by a consumer and for providing audible and visual indications to a user is illustrated in FIG. 1. Generally, the IED 10 includes sensors 12, a plurality of analog-to-digital (A/D) converters 14 and a processing system including a central processing unit (CPU) 18 and/or a digital signal processor (DSP) 16. The sensors 12 will sense electrical parameters, e.g., voltage and current, of the incoming lines from an electrical power distribution system. Preferably, the sensors will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 14 configured to convert the analog output voltage from the transformer to a digital signal that can be processed by the CPU 18 or DSP 16.

The CPU 18 is configured for receiving the digital signals from the A/D converters 14 to perform the necessary calculations to determine the power usage and controlling the overall operations of the IED 10. In a preferred embodiment, the DSP 16 will receive the digital signals from the A/D converters 14 and perform the necessary calculations to determine the power usage to free the resources of the CPU

18. The CPU 18 will include a microprocessor 20 executing instructions and performing various calculations, flash memory 22 for storing executable instructions and permanent data tables for controlling the overall operation of the microprocessor and random access memory (RAM) 24 for holding data during computations by the microprocessor 20.

A first memory 26 is coupled to CPU 18 and stores calibration and setup parameters of the IED 10, e.g., meter configuration, serial number of the device, etc. Memory 26 may be an integrated circuit in the form of a FLASH or EEPROM, or any other known or to be developed type of memory which is nonvolatile, capable of being changed in the IED, and amenable to making such changes difficult for an end user.

The IED 10 further includes a second memory 28 for storing sensed and generated data for further processing and for retrieval, e.g., data logs. Memory 28 may be flash memory and may be removable or non-removable. In one embodiment, data stored on memory 28 may be retrieved by an external device or computer via a communication device 30. In another embodiment, where memory 28 is removable, memory 28 will be in the form of a memory card such as a CompactFlash card, a Memory Stick, a SmartMedia card, etc., and data stored therein will be retrieved from an appropriate memory card reader.

A power supply 32 is also provided for providing power to each component of the IED 10. In one embodiment, the power supply 32 is a transformer with its primary windings coupled to the incoming power distribution lines and having an appropriate number of windings to provide a nominal voltage, e.g., 5 VDC, at its secondary windings. In other embodiments, power is supplied from an independent source to the power supply 32, e.g., from a different electrical circuit, an uninterruptible power supply (UPS), etc.

The IED 10 of the present disclosure will have a user interface for interacting with a user and for communicating events, alarms and instructions to the user. The user interface will include a display 34 for providing visual indications to the user. The display 34 may include a touch screen, a liquid crystal display (LCD), a plurality of LED number segments, individual light bulbs or any combination of these. The display 34 may provide the information to the user in the form of alpha-numeric lines, computer-generated graphics, videos, etc. The user interface will include an input device 35 for entering data, e.g., parameters, limits, etc. The input device may include pushbuttons, a keypad, a touch screen, at least one dial, etc. The user interface may also include a speaker or audible output means 36 for audibly producing instructions, alarms, data, etc. The speaker 36 will be coupled to the CPU 18 via a digital-to-analog converter (D/A) for converting digital audio files stored in memory to analog signals playable by the speaker 36.

The IED 10 will include the communication device 30 for enabling data communications between the IED 10 and other computing devices, e.g., a desktop computer, laptop computer, other IEDs, etc. The communication device 30 may be a modem, network interface card (NIC), wireless transceiver, etc. As described above, the IED 10 may be coupled to a personal computer over a network, e.g., a LAN, WAN, the Internet, etc., via the communication device 30, where the personal computer will retrieve data, e.g., logs, from the IED 10. The communication device 30 will perform its functionality by hardwired and/or wireless connectivity. The hardwire connection may include but is not limited to hard wire cabling e.g., parallel or serial cables, USB cable, Firewire (1394 connectivity) cables, and the appropriate port. The wireless connection will operate under any of the various known wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols or systems currently existing or to be developed for wirelessly transmitting data. It is to be appreciated that the network may be a local area network (LAN), wide area network (WAN), the Internet or any known network that couples a plurality of computers to enable various modes of communication via network messages. Furthermore, the IED 10 will communicate using the various known protocols such as Transmission Control Protocol/Internet Protocol (TCP/IP), File Transfer Protocol (FTP), Hypertext Transfer Protocol (HTTP), etc. and secure protocols such as Internet Protocol Security Protocol (IPSec), Point-to-Point Tunneling Protocol (PPTP), Secure Sockets Layer (SSL) Protocol, etc.

It is to be understood that the present disclosure may be implemented in various forms of hardware, software, firmware, special purpose processors, or a combination thereof. The IED may also include an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

As the IED 10 collects data and processes the collected data, the data will be stored on, for example, flash memory 28. The data may be stored in various types of logs, e.g., a historical trend log which is a collection of time-stamped records used to track any parameter over time. Other exemplary logs may include limit logs, event-triggered waveforms logs (e.g., records a waveform when a user-programmable value goes out of limit and when the value returns to normal), power quality logs (e.g., records magnitude and duration of voltage and current surges and sags for every power quality event), status change (input) logs, control output (relay) logs, system event logs, flicker logs and reset logs. However, flash devices "wear out" after a large but finite number of erases. Furthermore, the IED 10 may determine and store meter diagnostic data. This can become an issue if the same place in the flash memory is used over and over again.

Flash devices are partitioned into sectors and impose the rule that all bytes in a sector must be erased at the same time. Thus, for managing the number of erases, the sector is the basic unit. The IED 10 of the present disclosure manages sector wear by placing data in the flash memory 28 so that the number of erases in all sectors is equalized over time. The IED 10 uses the flash memory for its logs. This technique is appropriate for any similar application in which memory contents change over time and in which there is slightly more capacity in the flash memory than is actually needed. The extra capacity is used to ensure that free sectors are always available when needed.

In one embodiment, the memory for storing the data and/or logs is configured as removable memory. The IED of this embodiment facilitates replacing or swapping out the memory if the memory is "worn" or about to go bad. In one embodiment, the IED will utilize a USB (Universal Serial Bus) architecture for communicating generated data to the removable memory.

Figure 2A:
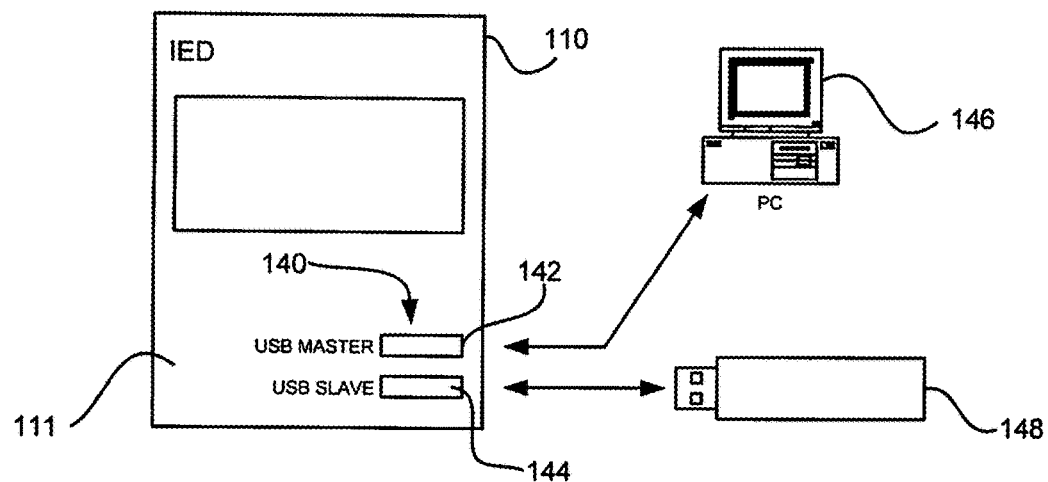
FIG. 2A is a diagram of an intelligent electronic device utilizing a USB (Universal Serial Bus) architecture in accordance with an embodiment of the present disclosure.

Referring to FIG. 2A, an IED 110 utilizing a USB architecture in accordance with the present disclosure is Illustrated. The IED 110 shown in FIG. 2A includes a USB interface 140 disposed on an external surface of a housing 111 of the IED 110. The USB interface 140 includes a USB master port 142 and a USB slave port 144. The USB master port 142 will allow a USB master device, e.g., PC 146, to access the internal memory of the IED 110. When a USB master device is coupled to the IED 110 via port 142, the IED 110 will respond as a USB slave device. Furthermore, the IED 110 acts as a USB master device when a slave device, e.g., removable storage device 148, is coupled to the USB slave port 144.

One of the common issues with USB design is that since the connections are electrical and not optical connections, they run a danger to the user when connected to a high power source, e.g., an electrical power distribution system. Because of this danger, there will need to be a large amount of isolation between the USB connector and the electrical voltage input. One elegant and innovative way of providing isolation is to connect the USB connector port to the front panel of the housing and then utilize the power coming from the USB reading device, i.e., master device, and not from the meter or IED to power the connector and the USB electronics.

Figure 2B:
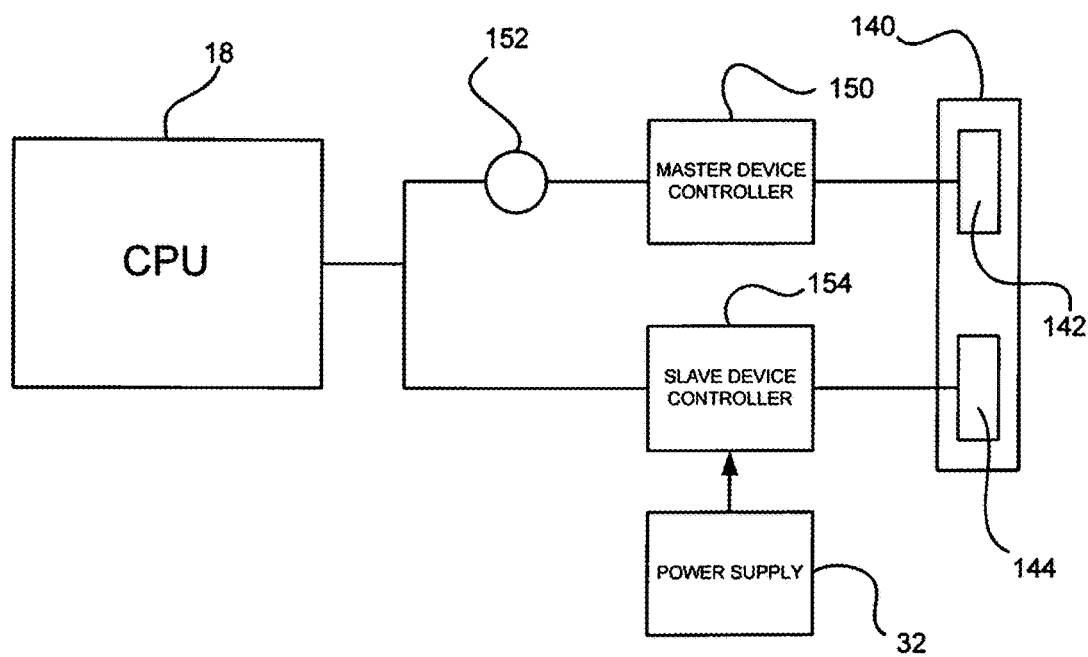
FIG. 2B is a schematic diagram of the USB architecture employed in the IED shown in FIG. 2A.

Referring to FIG. 2B, a schematic diagram of a USB architecture in accordance with one embodiment of the present disclosure is illustrated. USB master port 142 is coupled to a master device controller 150. The master device controller 150 may be any known programmable device operating in accordance with one of the various known USB specifications and may include one or more drivers for various master devices. It is envisioned that the master device controller could be a separate hardware chip or processing module or could be embedded directly into the host CPU 18 as hardware, software or a combination thereof.

At least one optoisolator 152 is then coupled from the secondary of the USB chip 150 to the at least one host or intermediary processor 18 of the IED. This allows for very high electrical isolation and very low cost eliminating the needs of isolation transformers, a multiple tap power supply or DC to DC isolating power supplies. When a master device is coupled to the USB master port 142, the master device such as a lap top computer, smart phone or other intelligent device is providing power to the USB master device controller 150.

USB slave port 144 is coupled to a slave device controller 154. The slave device controller 154 may be any known programmable device operating in accordance with one of the various known USB specifications and may include one or more drivers for various slave devices. The slave device controller 154 is coupled to the at least one host or intermediary processor 18 of the IED without the use of an optoisolator. Since the slave device, e.g., a memory stick, in most cases will not have a power source, a power source internal to the IED will be utilized to power the slave device controller 154 and the slave device coupled to USB slave port 144. In one embodiment, power supply 32 will be coupled to the slave device controller 154. It is to be appreciated that at least one intermediary device may be used to coupled power supply 32 to the slave device controller 154 to step down or condition the power being provided. It is envisioned that the slave device controller 154 could also be separate hardware or a separate processing module or could be embedded into the host CPU 18 as hardware, software or a combination thereof.

It is envisioned by the teachings of the present disclosure that the USB master and USB slave connections depicted in FIG. 2A could also share the same physical USB connector, as will be described below. In this mode, the device or IED can auto-detect or a user could configure the port to act as a master or a slave port. All other embodiments are contemplated by the present disclosure such as for non-limiting example wireless USB or other similar architectures using embedded serial protocol.

Figure 3A:
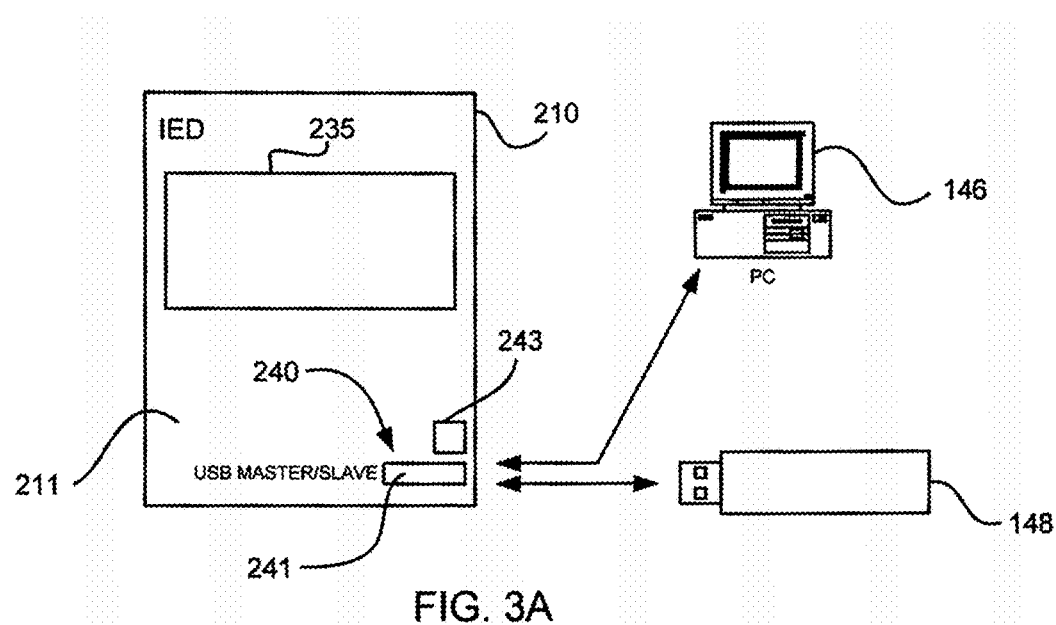
FIG. 3A is a diagram of an intelligent electronic device utilizing a USB architecture in accordance with another embodiment of the present disclosure.

In another embodiment, the IED 210 includes a USB interface 240 that has only one port 241 as shown in FIG. 3A. In this embodiment, port 241 may be utilized by a master device, e.g., PC 146, or a slave device, i.e., storage device 148. A switching mechanism is provided to change modes of the port 241 from a USB master to USB slave port. The switching mechanism could be physical or virtual utilizing software commands to change the port configuration. An exemplary virtual switching technique for an electrical panel meter is disclosed in commonly owned U.S. Pat. No. 7,313,489 to Kagan, the contents of which are incorporated by reference in their entirety. The port may also self configure itself by utilizing software algorithms or hardware schemes such as signal change detection or other type of software algorithm all of which are contemplated in the present disclosure.

Figure 3B:
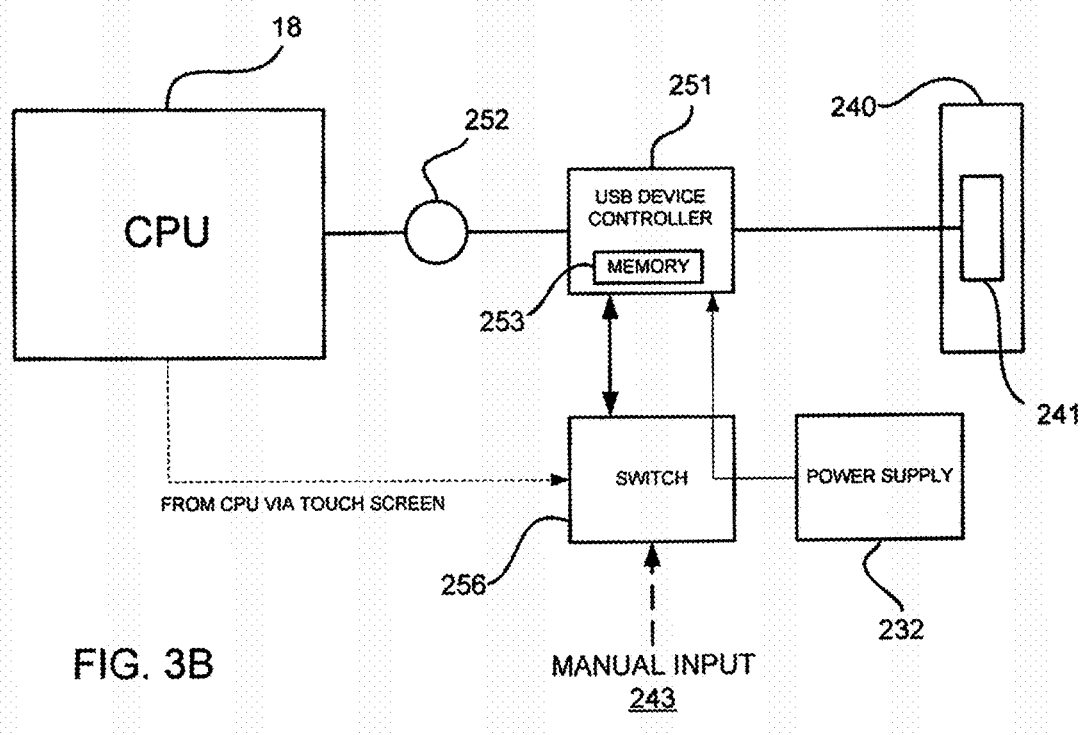
FIG. 3B is a schematic diagram of the USB architecture employed in the IED shown in FIG. 3A.

Referring to FIG. 3B, a schematic diagram for the USB architecture employed in the IED shown in FIG. 3A is illustrated. In this embodiment, the port 241 is disposed on an external surface of housing 211 and is coupled to a single device controller 251. At least one optoisolator 252 is coupled from the secondary of the USB chip 251 to the at least one host or intermediary processor 18 of the IED. The device controller 251 is capable of operating in a master mode or slave mode upon loading of an appropriate driver. It is to be appreciated that device controller 251, in certain embodiments, will have on-board memory 253 for storing, among others, at least one master driver and at least one slave driver. In other embodiments, the master/slave drivers may be stored in other memory, e.g., flash memory 22, and, upon determining the proper mode, the CPU 18 will retrieve the appropriate driver and load it into the device controller 251. In further embodiments, the appropriate driver will be transmitted to the device controller 251 from the external device being coupled to port 241.

The mode of the device controller 251 will be determined based on the type of device coupled to port 241. If a master device, e.g., PC 146, is coupled to the port 241, the device controller 251 will need to operate in a master mode. In one embodiment, switch 256 will transmit a control signal to the device controller 251 to change its mode. The switch 256 will operate either based on a manual input via a button or the like 243 mounted on the IED adjacent to the port 241 or the switch will receive a signal from the CPU 18 in the case where an operator changes the mode via a touch screen 235. When the device controller 251 is placed in the master mode, that is, a USB master device is coupled to port 241 and the IED 210 is operating as a USB slave, switch 256 sends a master control signal to the device controller 251 and removes the power supply from the circuit. In the master mode of the device controller 251, the device controller 251 will receive power via the port 241 from the master device, e.g., a laptop computer. When the device controller 251 is placed in the slave mode, that is, a USB slave device is coupled to port 241 and the IED 210 is operating as a USB master, switch 256 sends a slave control signal to the device controller 251 and switches in the power supply 232 to the circuit. In the slave mode of the device controller 251, the device controller 251 will receive power via the power supply 232 and provide power to the slave device, e.g., a removable memory device.

It is to be appreciated that the mode of the device controller 251 could be switched automatically without a manual input from an operator. For example, the device controller 251 will auto-detect if the connected device is a master or slave device. For example, once the device controller 251 determines that something is connected to port 241, the device controller will wait a predetermined period of time to see if a command or message is received. If no command or message is received, the connected device is most likely a slave device since slave device do not send commands or messages and the device controller 251 will send an appropriate control signal to switch 256. Alternatively, if the device controller 251 receives a command or message from the connected device, the device controller 251 will send the appropriate signal to the switch 256 to remove power.

In utilizing the hardware device(s) described herein, the user will be able to accomplish the various applications of the disclosure which are described below.

Utilizing a USB memory stick, the IED of the present disclosure will be a USB master. As a USB master, the IED uses the USB memory stick as a storage medium. The USB master could treat the stick as a USB hard drive or a form of IDE interface. This being the case, the IED will be programmed to control the USB memory stick for placing data and/or files on to the memory stick. The IED will perform this function by sensing the electrical parameters of the electrical power distribution system, processing the data collected from the sensors 12 and analog-to-digital converters 14 and then storing the raw or modified or computed results from such sensing to the USB "drive". The IED will also utilize a real time clock or other type of time sensing algorithm to store with data a time stamp. This will allow a user to have timed analysis of events on the line of the electrical power distribution system.

Utilizing this technique, the user will be able to ascertain historical profiling such as by non-limiting example 15 minute watt and VARs distribution, energy over a month and many other applications. Additionally, the IED can be configured to sense or received data from sensors or be coupled to external sensors whether directly or indirectly to sense non-electrical parameters such as ambient temperature, gas pressure, greenhouse emissions or other such parameters. This data can be stored with the time stamp in the USB drive for additional later analysis.

In one embodiment, the IED stores the data in a comma separated value (CSV) format, as shown in FIG. 4, so that the data can be easily imported into standard data analysis software such as spreadsheets, databases, etc. The format will normally include data and/or the time/date stamp related to that data or some form of time/date encoding so that a software package will be able to ascertain the time and/or date for when the data was captured and/or stored.

Other non-limiting embodiments include that data can be stored in a binary or ASCII format so that either a computer could read or process the data in a recognizable format. Such storage of data could include the Electric Power Research Institute PQDIF format, Comtrade format and/or ANSI C12.19 protocol data. Other protocols and file formats are contemplated by the present disclosure. The above are only for illustrative examples.

Furthermore, the USB memory stick, i.e., USB slave device, could also be used to store a shadow copy of the internal system memory or be used as a debug device for the IED to ascertain if it is working properly. This USB memory stick or device could be used by the IED to store debug codes, failures codes or provide a log of executable information that the internal IED processor is using.

When the IED is operating as a USB slave, the IED to be able to download stored data from internal meter storage and is treated like a "serial" port wherein a computing device can establish a communication stream with the meter by serial master/slave communication such as but not limited to Modbus and DNP 3.0 type protocols or PPP, TCP/IP or other such communication protocols. The USB "slave" could also allow data to be sent to and from the IED utilizing file transferring methods such as FTP or other such file transferring protocol.

Other forms of data retrieval anticipated by the present disclosure would be to use removable serial flash such as SD flash manufactured by SanDisk Corporation of Milpitas, Calif. (an exemplary flash is commercially available as model number SDSDRH-032G-A11) or parallel flash such as but not limited to NOR flash and Compact Flash, an example of which is manufactured by SanDisk Corporation as model number SDCFX-032G-A61. This technology will enable use similar to the USB type device and as such is contemplated by the present disclosure.

Different mounting forms are envisioned by the present disclosure. One preferable form would be to mount the USB port in the front panel of the device. This allows a user to access either the USB port to remove and install new USB media, e.g., a storage device. The USB media can be mounted on the front panel of the device anywhere accessible to a meter once install in an electrical switchgear panel. Other mounting options would include mounting the USB storage device in the rear of the instrument behind the electrical switchgear providing some security from unauthorized removal.

Figure 5A:
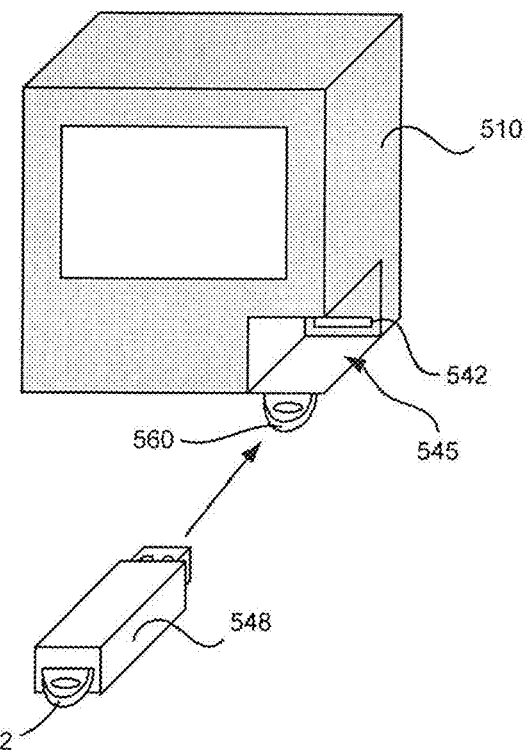
FIGS. 5A-5C illustrate an IED utilizing a USB memory device in accordance with an embodiment of the present disclosure.
Figure 5B:
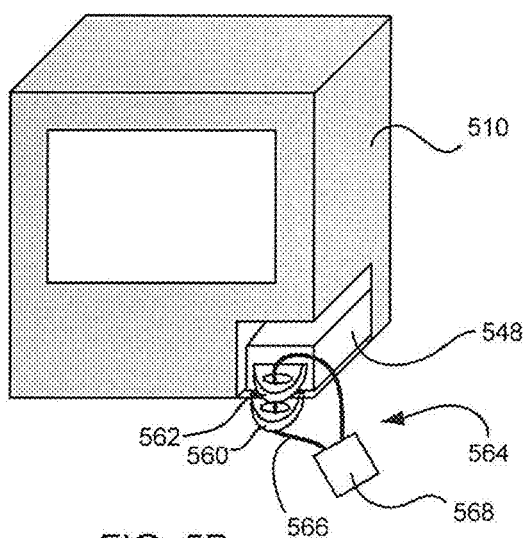

In one embodiment, the USB interface 542 is disposed in a recess 545 of the housing of the IED 510 as illustrated in FIG. 5A. In this embodiment, the recess 545 is configured to fully accept the USB memory stick 548 to protect the USB memory stick or device from damage. In certain embodiments, both the housing of the IED 510 and the USB memory stick 548 include corresponding ring members 560, 562 respectfully. As shown in FIG. 5B, when the USB memory stick is fully disposed in the recess 545, the corresponding ring members 560 and 562 align so a security device 564 can be applied therethrough, e.g., a wire 566 and seal 568, to prevent unauthorized removal of the USB device 548 and to indicate tampering.

Figure 5C:
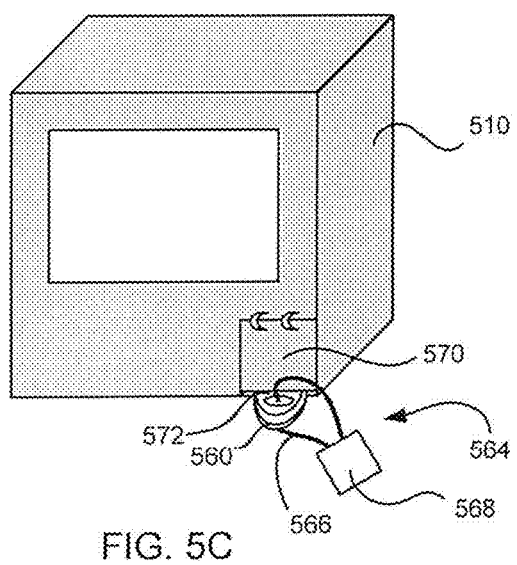

It is also envisioned that mounting could be within a door 570 on the instrument or IED 510 providing an enclosed structure for the USB or similar type memory as illustrated in FIG. 5C. The door 570 for the memory could then be sealed utilizing a type of lock or seal, e.g., wire 566 and seal 568. In this embodiment, ring member 560 remains coupled to the housing of the IED 510 and ring member 572 is coupled to the door 570. There are many mechanical methods of placing and/or securing the memory to the meter 510, whether internal or external with or without a door and these methods are envisioned by the present disclosure.

It is to be appreciated that the IED may communicate to devices other than a storage device. For example, when the IED is in a master mode, the IED may be coupled to a USB slave device(s) such as: a printer for printing data measured or calculated by the IED; an input device, e.g., a mouse, joystick, keyboard, etc., for navigating the display 34; a image capture device, e.g., a webcam, to capture images of the environment surrounding the IED; and a communication device (e.g., a modem, a wireless transceiver, a network interface card, etc.) for enabling the IED to transmit or forward its data to other IEDs, computing devices, servers, etc. It is to be appreciated this listing of USB slave devices is merely illustrative and not exhaustive of the possible devices that could be coupled to the IED.

In one embodiment, the IED is configured or selected to be the USB master device and can connect up to 127 slaves devices via at least one USB hub. In this embodiment, the USB master device, will go through an enumeration process, either on power up or when devices are connected via a USB bus, and assign each connected slave device an address. The IED as the USB master device will query each device to find out what type of data transfer the specific device wants to perform, for example, interrupt mode, bulk transfer mode or isochronous mode. The IED as the USB master device can also send commands or query parameters with control packets. The Universal Serial Bus divides the available bandwidth into frames with the USB master IED device keeping track of the total bandwidth that the slave devices are requesting and controls the frames to ensure the slaves devices get the bandwidth they need.

It is to be appreciated that the teachings, and devices, of the present disclosure are compatible with any known or to be developed USB standard, for example, USB 1.0, 2.0 and 3.0 (also known as SuperSpeed USB) including any preceding and intermediate versions. Furthermore, the architectures disclosed herein support the following signaling or transmission rates: a low speed rate of 1.5 Mbits/s as defined by USB 1.0; a full speed rate of 12 Mbits/s as defined by USB 1.1; a hi-speed rate of 480 Mbits/s as defined by USB 2.0; and a SuperSpeed rate of 5.0 Gbits/s as defined by USB 3.0. Other signaling or transmission rates are also contemplated. Regardless of the specific standard employed, the IED of the present disclosure is forward and backward compatible to communicate to any existing or to be developed external device.

Furthermore, it is to be appreciated that the disclosed interfaces or ports, e.g., interfaces 140, 240 and ports 142, 144, 241, include any known or to be developed USB connector, e.g., a plug or receptacle, such as a type A connector, a type B connector, Mini-A connector, Mini-B connector, Micro-A connector, Micro-B connector, Micro-AB connector, etc. Additionally, the interfaces and ports may include proprietary connectors such as the UltraPort employed by IBM, 10P10C connectors employed by American Power Conversion, HTC ExtUSB employed by HTC Corporation, the Port-Port connector employed by Nokia, among others.

Figure 6A:
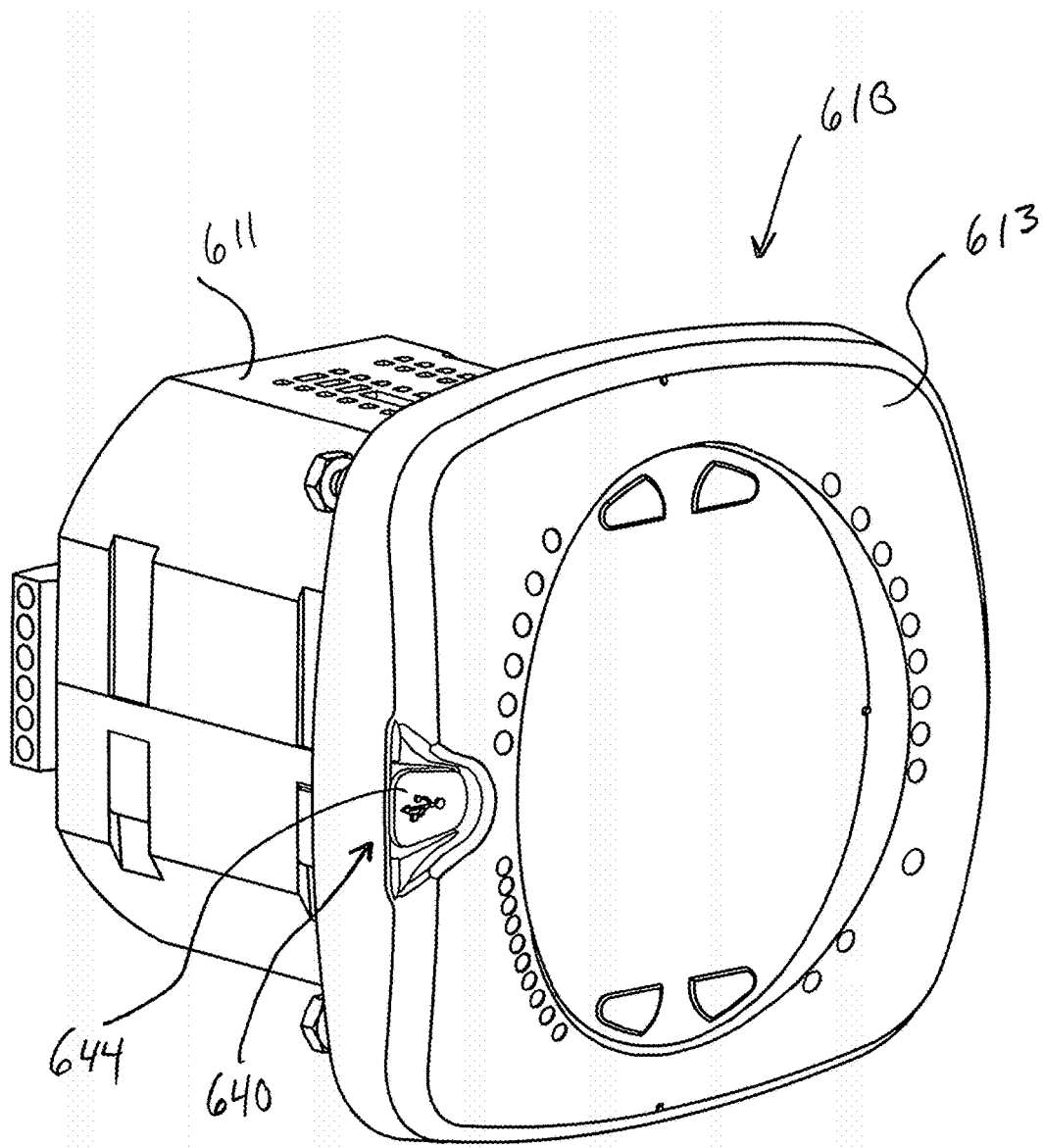
FIGS. 6A-6H illustrates various views of an intelligent electronic device in accordance with an embodiment of the present disclosure.
Figure 6B:
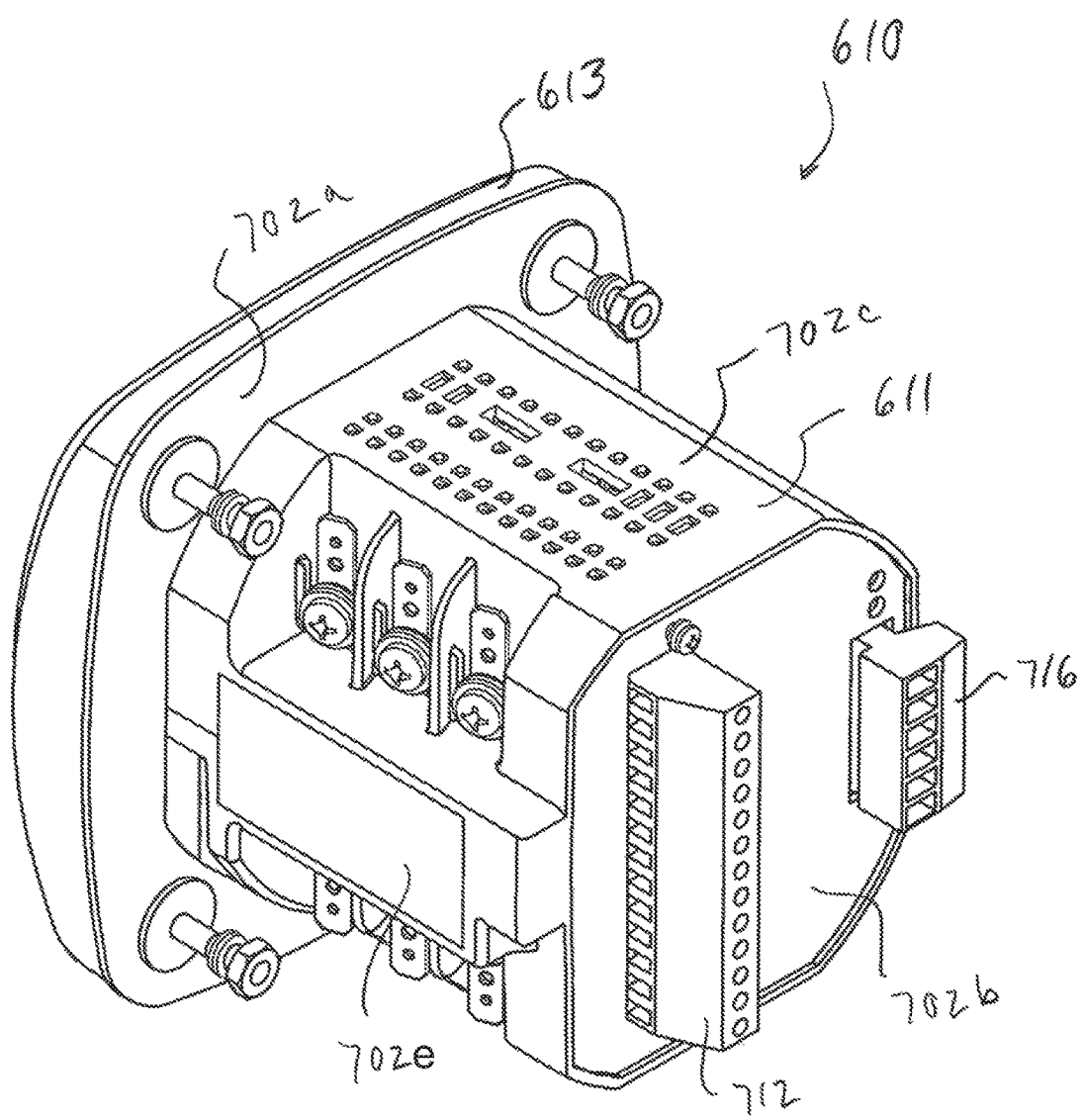
Figure 6C:
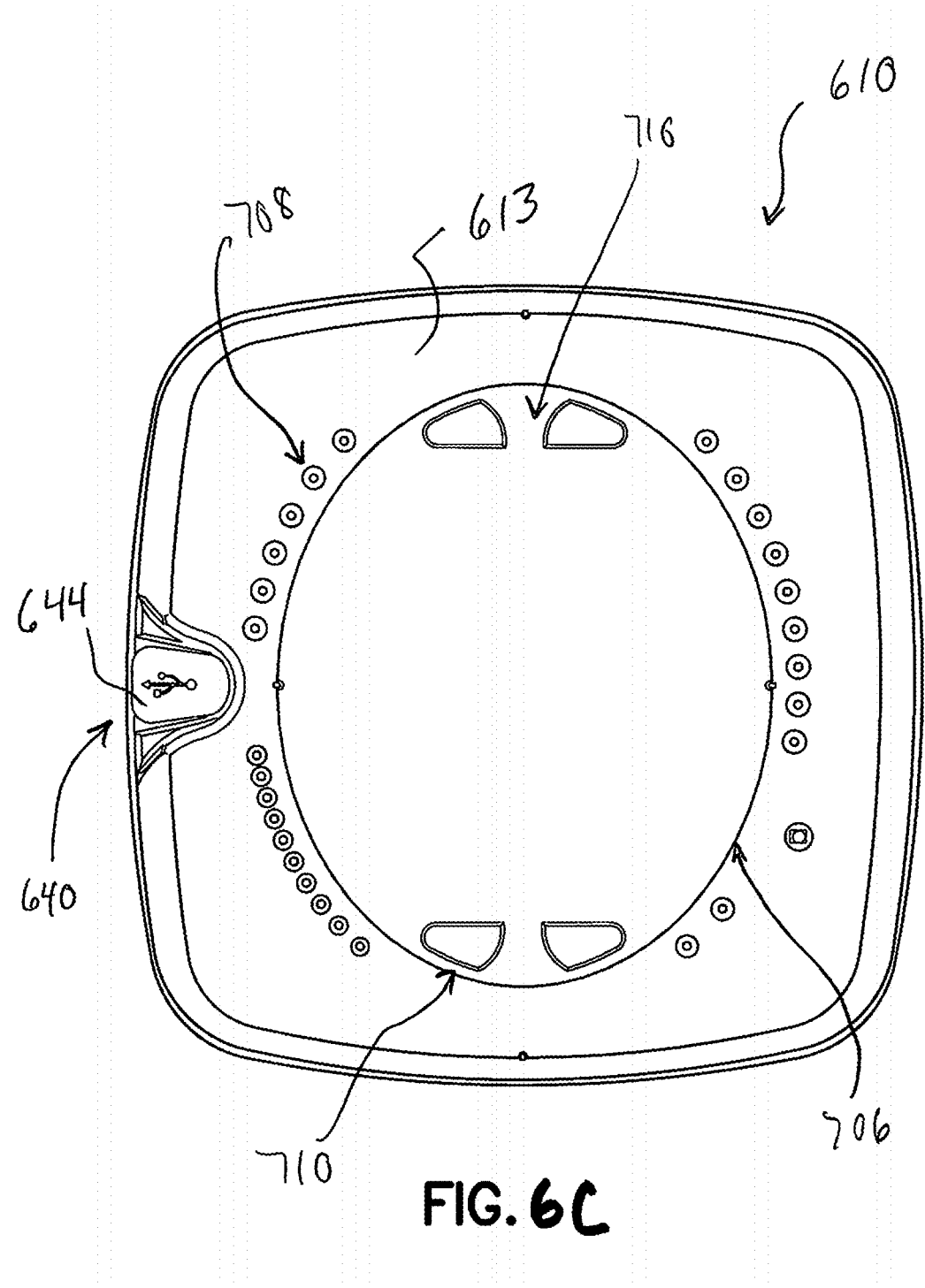
Figure 6D:
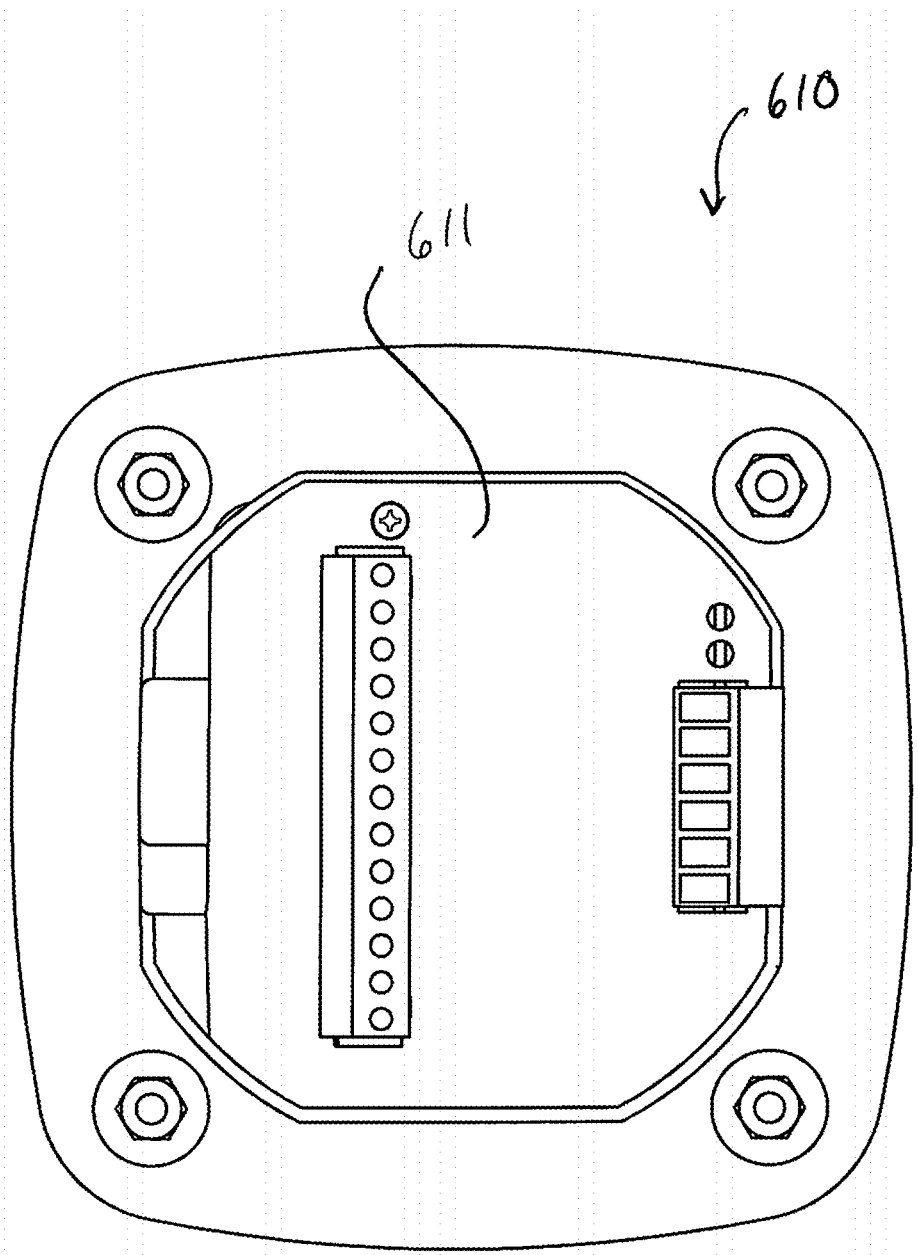
Figure 6E:
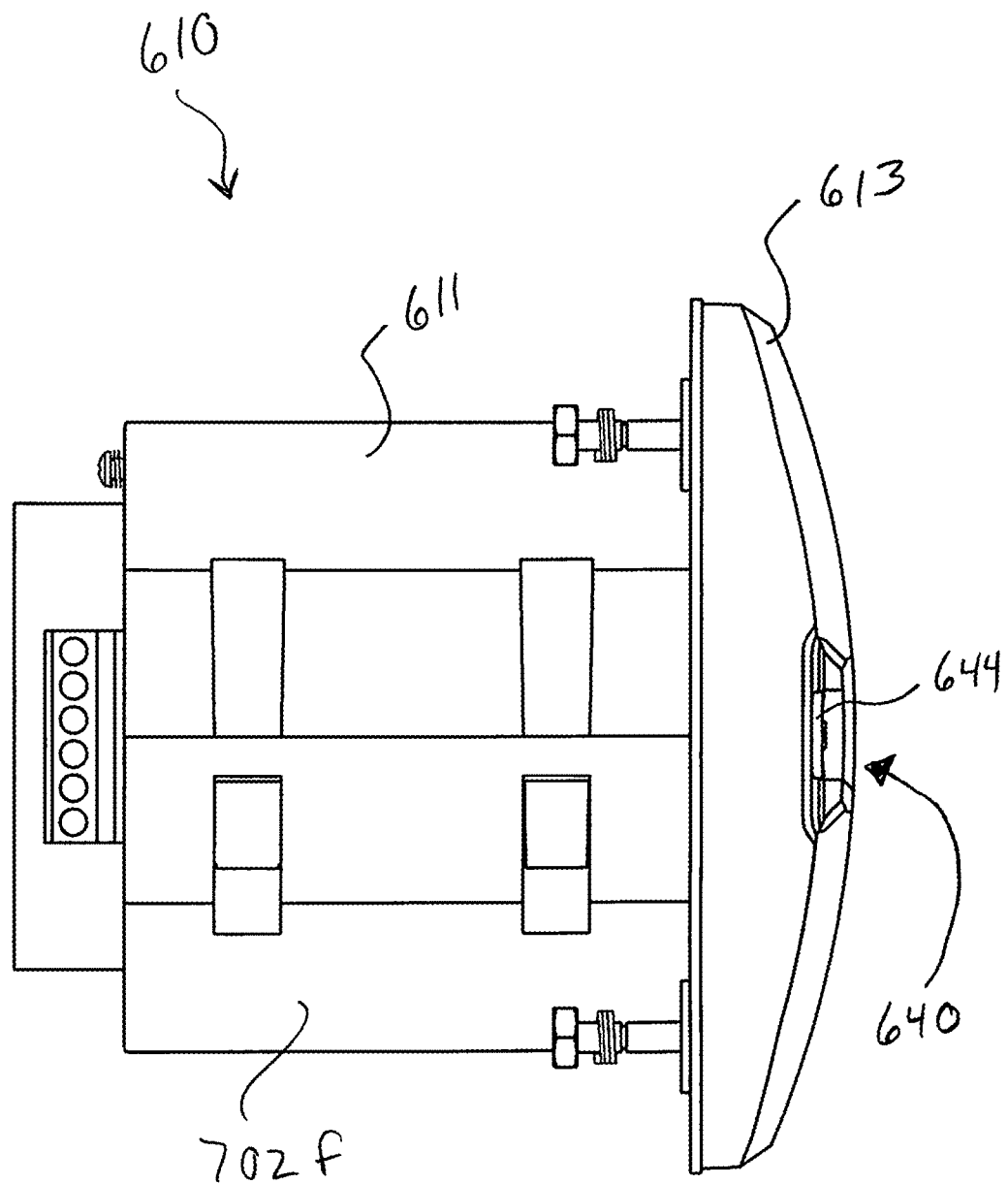
Figure 6F:
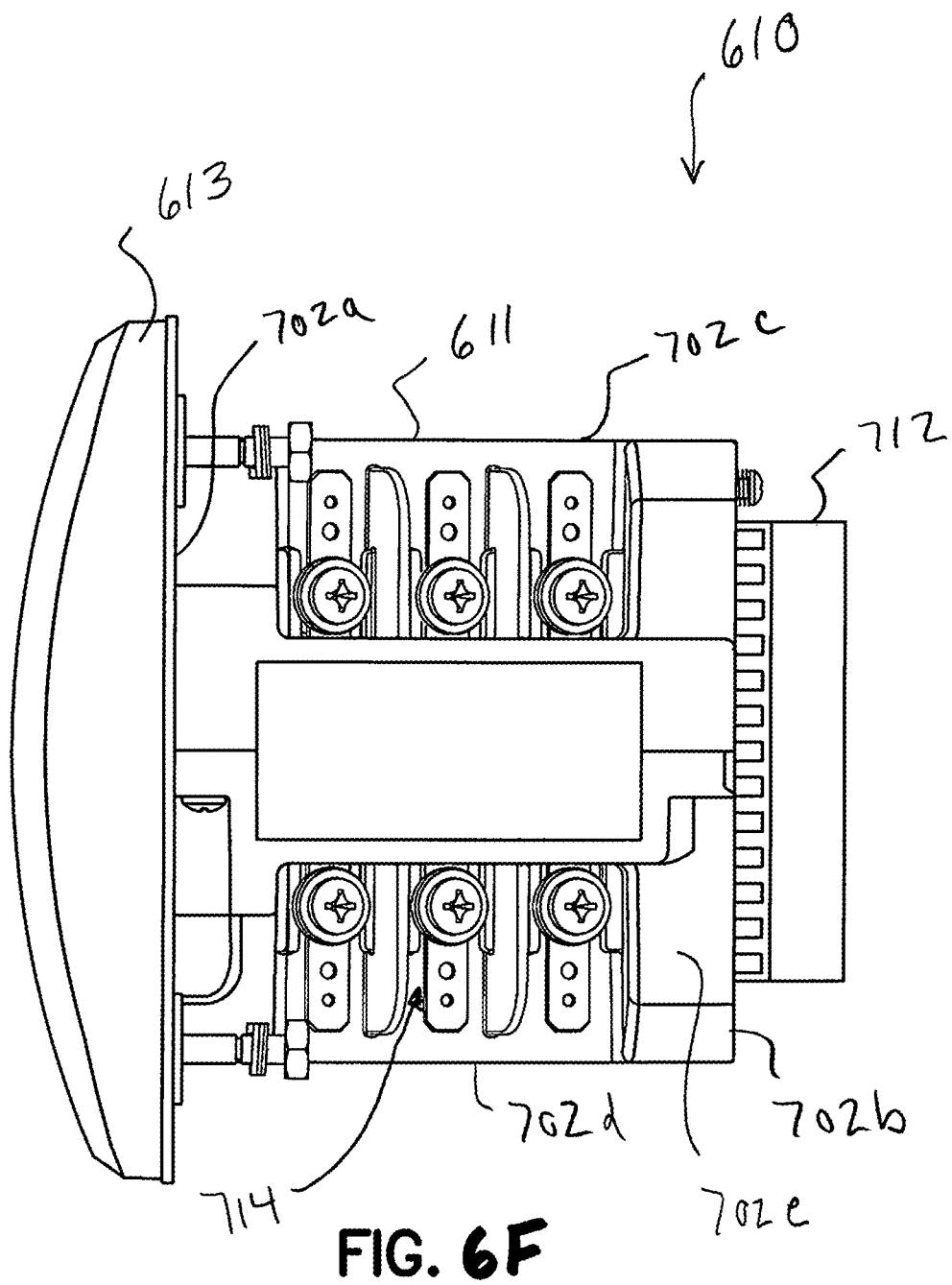
Figure 6G:
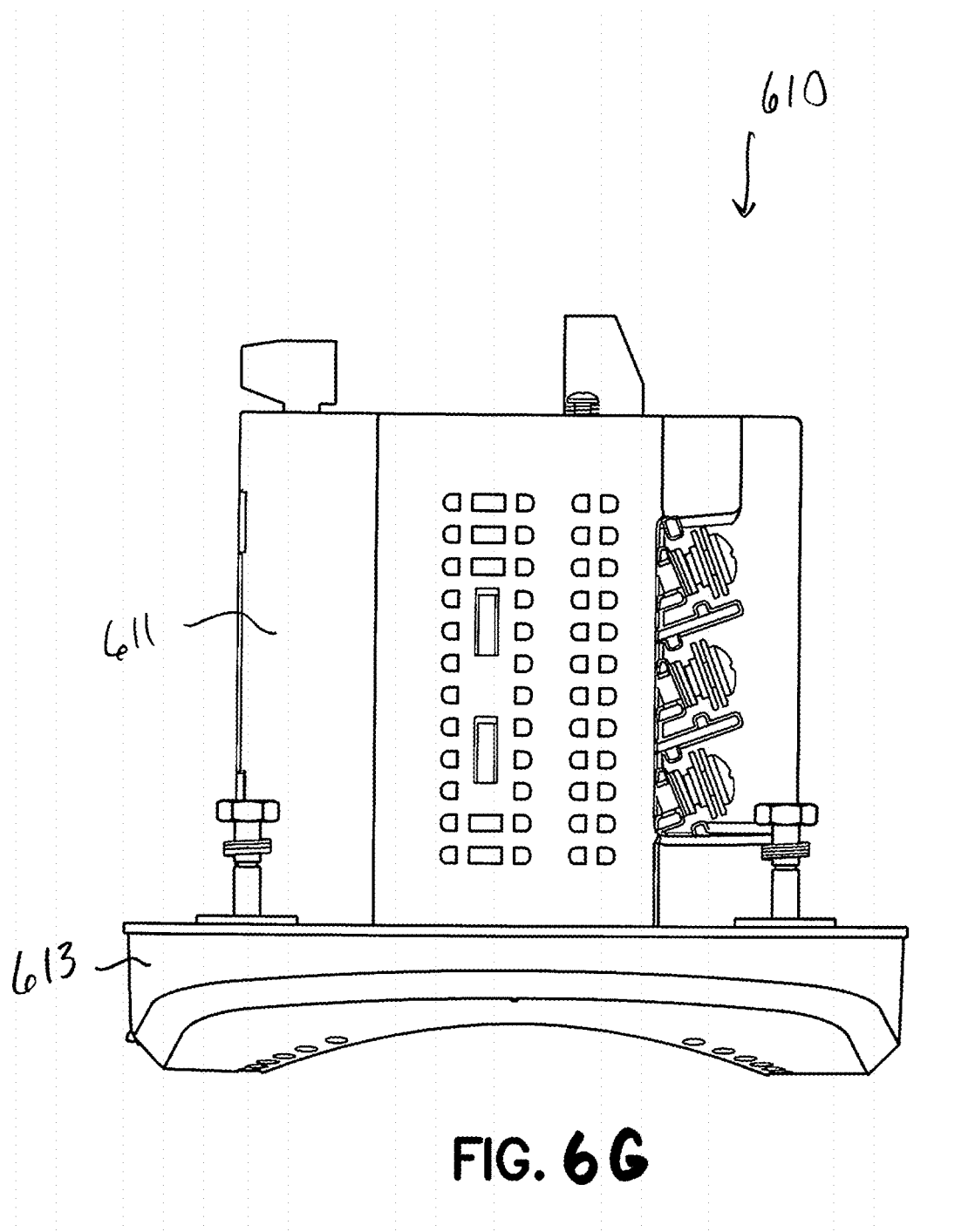
Figure 6H:
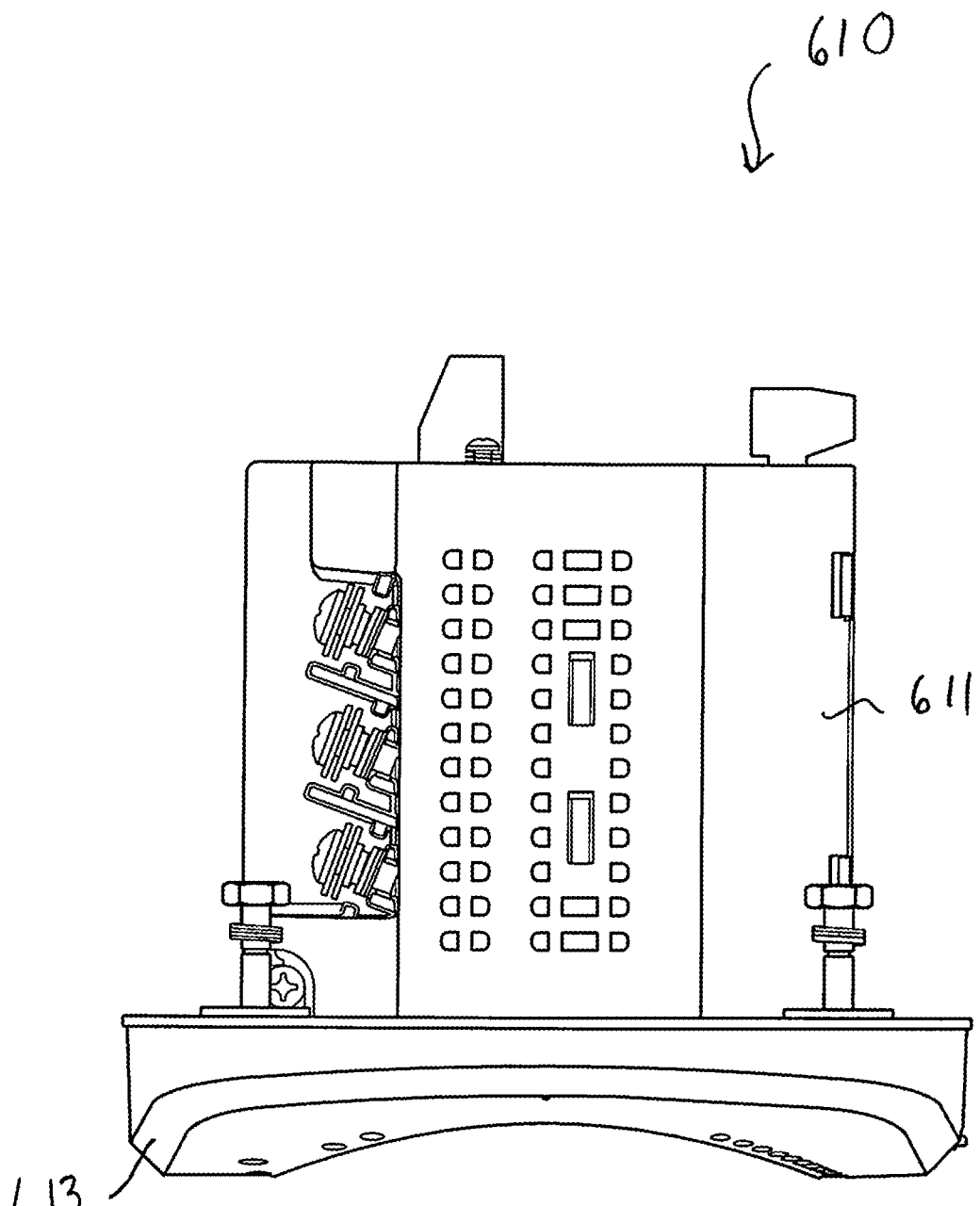

Referring to FIG. 6A-6H, an IED 610 in accordance with another embodiment of the present disclosure is illustrated. The IED 610 is configured as a panel meter. An exemplary panel meter is described in commonly owned U.S. Pat. No. 7,271,996, the contents of which are hereby incorporated by reference. As seen in FIGS. 6A-6H, the IED 610 includes a housing 611 defining a front surface 702a, a rear surface 702b, a top surface 702c, a bottom surface 702d, a right side surface 702e, and a left side surface 702f. Electrical device 610 includes a face plate 613 operatively connected to front surface 702a of housing 611. Face plate 613 includes displays 706, indicators 708 (e.g., LEDs and the like), buttons 710, and the like providing a user with an interface for visualization and operation of electrical device 610. For example, as seen in FIG. 6C, face plate 613 of electrical device 610 includes analog and/or digital displays 706 capable of producing alphanumeric characters. In one embodiment, the display 706 is configured as a user interface in accordance with any of the previously described embodiments.

Additionally, the face plate 613 includes a plurality of indicators 708 which, when illuminated, indicate to the user the "type of reading", the "% of load bar", the "parameter designation" which indicates the reading which is being displayed on displays 706, a "scale selector" (e.g., Kilo or Mega multiplier of Displayed Readings), etc. Face plate 613 includes a plurality of buttons 710 (e.g., a "menu" button, an "enter" button, a "down" button, a "right" button, etc.) for performing a plurality of functions, including and not limited to: viewing of meter information; enter display modes; configuring parameters; performing re-sets; performing LED checks; changing settings; viewing parameter values; scrolling parameter values; and viewing limit states. The housing 611 includes voltage connections or inputs 712 provided on rear surface 702b thereof, and current inputs 714 provided along right side surface 702e thereof. The IED 610 may include a first interface or communication port 716 for connection to a master and/or slave device. Desirably, first communication port 716 is situated in rear surface 702b of housing 611.

Figure 7A:
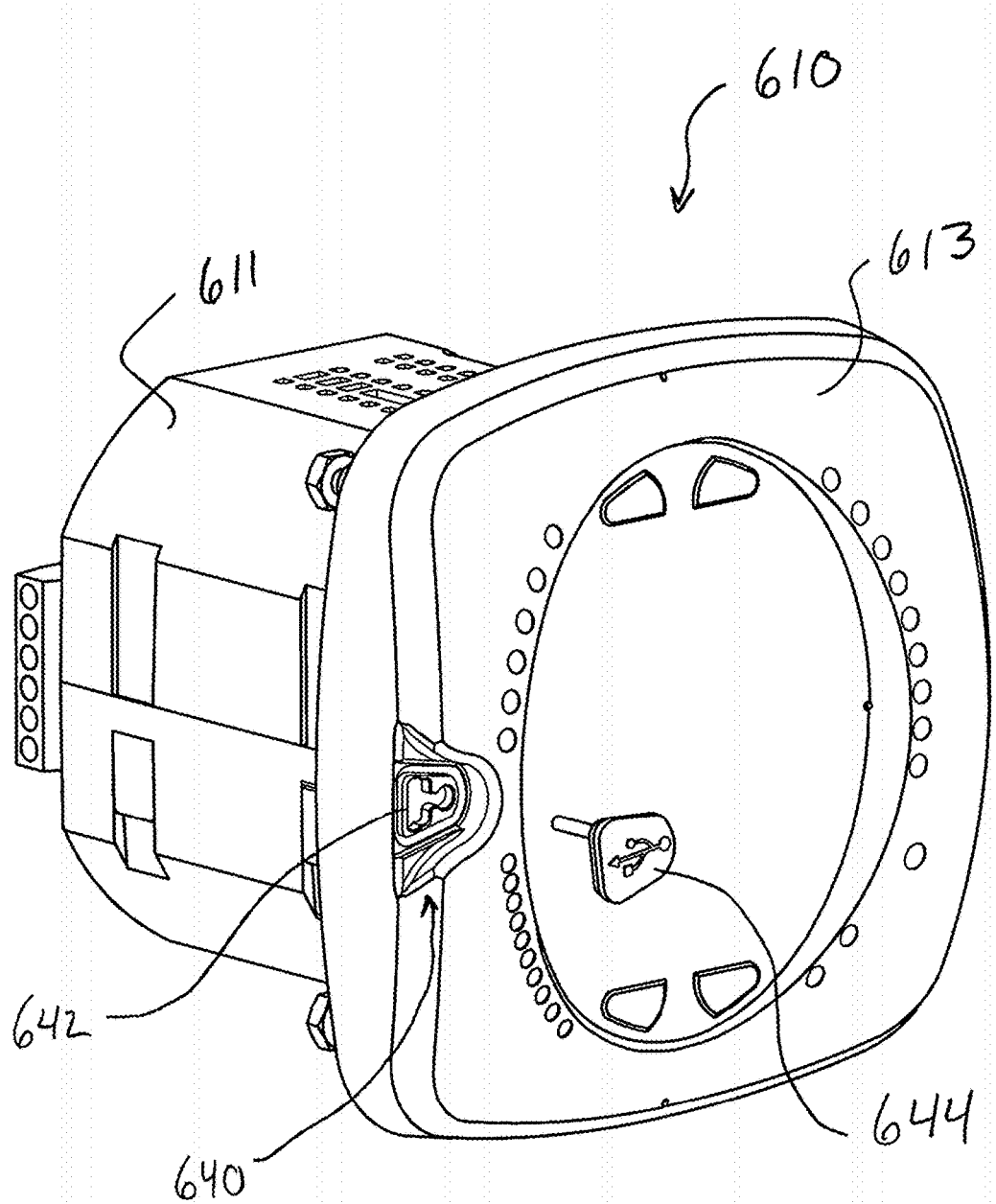
FIG. 7A is a front, top, left perspective view of an intelligent electronic device with a port plug removed in accordance with an embodiment of the present disclosure.
Figure 7B:
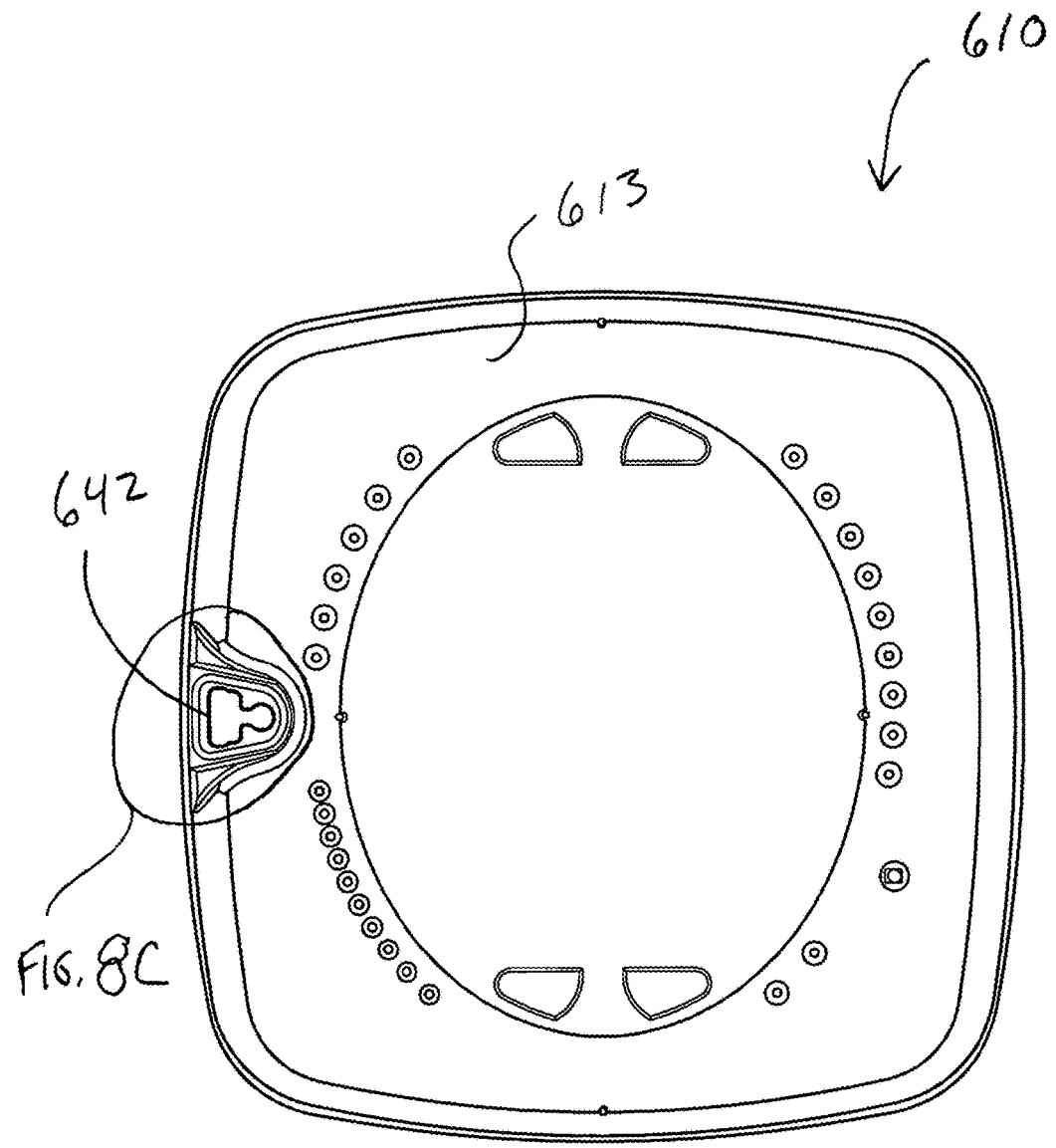
FIG. 7B is a front elevational view of an intelligent electronic device with a port plug removed in accordance with an embodiment of the present disclosure.

The face plate 613 further includes a communication interface 640. The interface 640 is protected by a plug 644 which when removed reveals a communication port opening 642, as shown in FIGS. 7A and 7B.

Figure 8A:
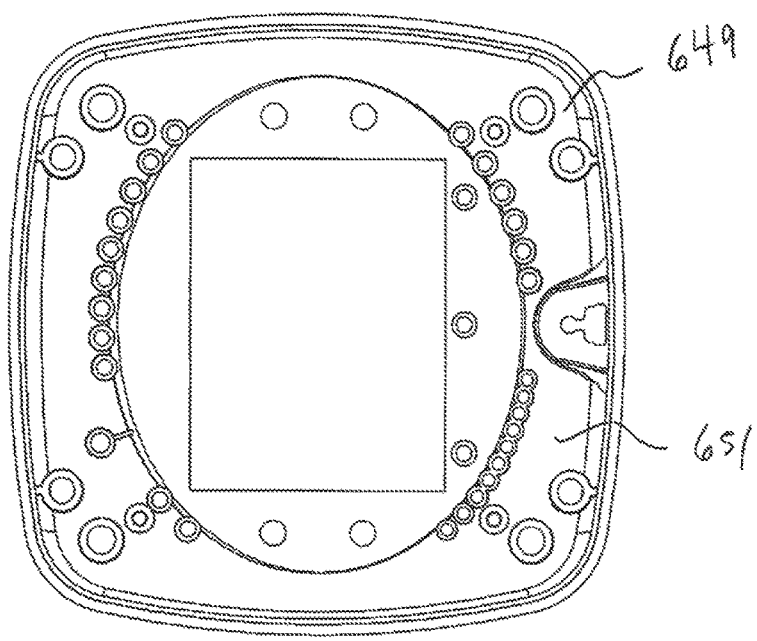
FIG. 8A is a rear elevational view of a bezel for an intelligent electronic device in accordance with an embodiment of the present disclosure.
Figure 8C:
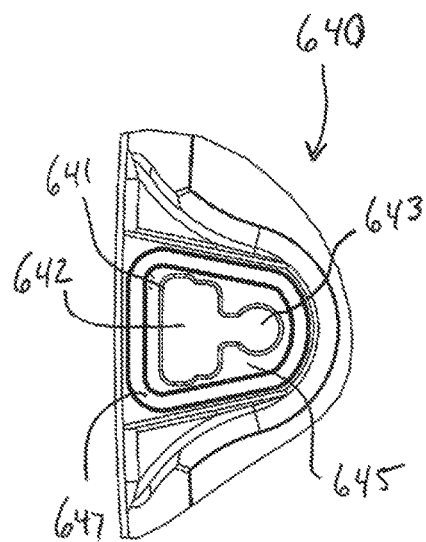
FIG. 8C is a partial view of the intelligent electronic device shown in FIG. 7B.

Referring to FIG. 8C, the interface 640 is illustrated in an enlarged view. The interface 640 includes a keyhole opening 641 which further includes a port opening 642, e.g., a USB port opening, and a circular opening 643 defined in a platform 645. The keyhole opening 641 is surrounded by a channel 647.

Referring to FIGS. 9A-9F, the plug 644 is shown. The plug 644 includes a cover 646 with a leg portion 648 extending perpendicular from the cover 646. The cover 646 further includes a lip portion 650 surrounding a periphery of the cover 646 and a seal 652 extending from the lip portion 650 around the periphery of the cover 646. The leg portion 648 further includes a step 654 for securing the plug 644 to the IED 610, as will be described below.

Figure 8B:
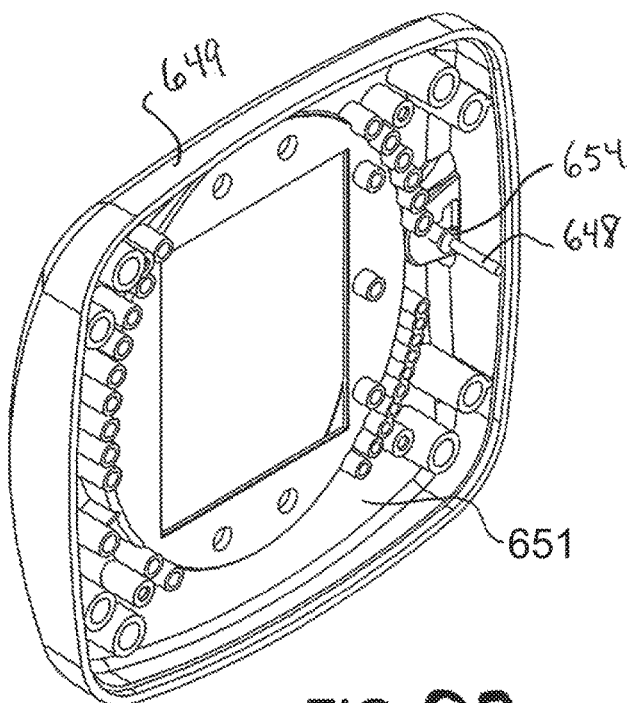
FIG. 8B is a rear perspective view of a bezel for an intelligent electronic device in accordance with an embodiment of the present disclosure.
Figure 9A:
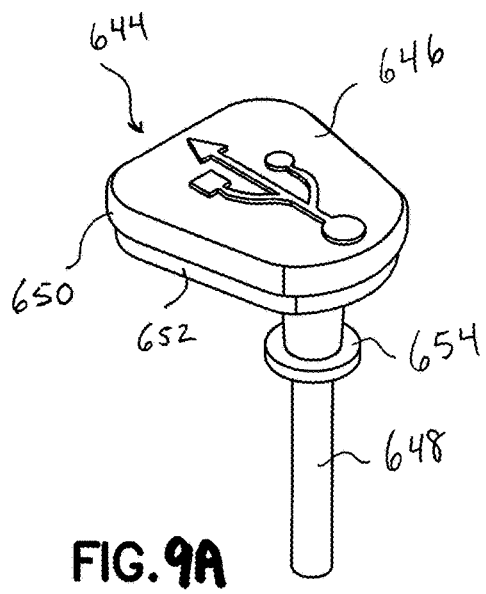
FIGS. 9A-9F illustrates several views of a port plug for an intelligent electronic device in accordance with an embodiment of the present disclosure.
Figure 9B:
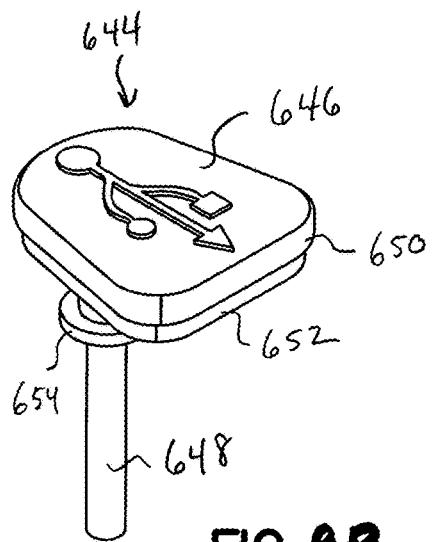
Figure 9C:
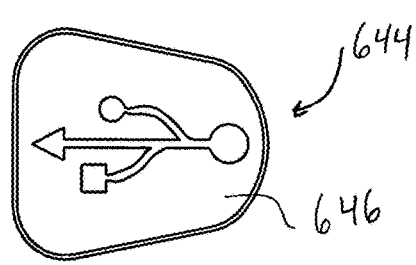
Figure 9D:
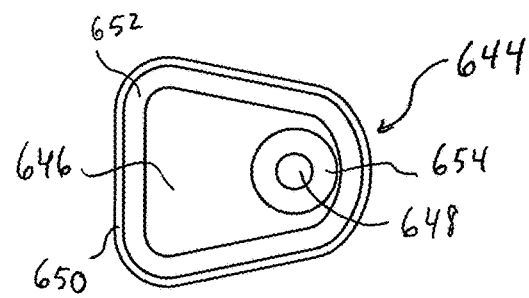
Figure 9E:
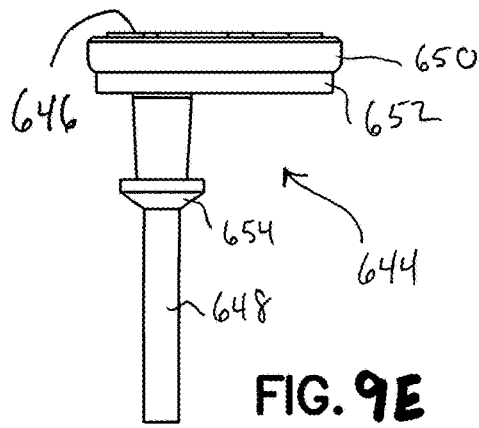
Figure 9F:
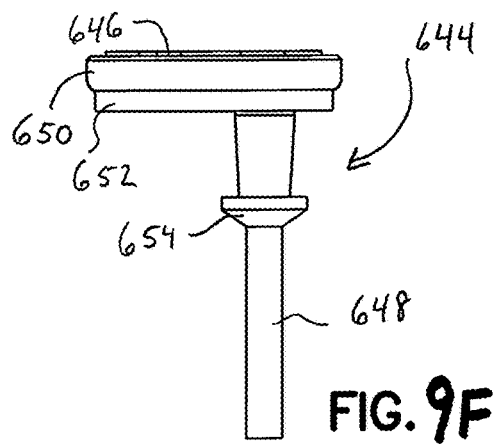

Referring to FIGS. 8A and 8B, a bezel 649 of the face plate 613 is removed from the housing 611 to illustrate how the plug 644 is coupled to the interface 640. As shown in FIG. 8B, the leg portion 648 of the plug 644 is inserted into the circular opening 643 from the front of the IED 610. The leg portion 648 is then pulled from a rear side 651 of the bezel until the step 654 of the leg portion 648 passes through to the rear side of the circular portion 643. The cover 646 may now be rotated about the longitudinal axis of the leg portion 648 to either seal the interface 640 or expose the port opening 642.

When sealing the interface 640 with the plug 644, the cover 646 is aligned with the channel 647 and pressed toward the face of the IED 610. The seal 652 mates with the channel 647 until the lip portion 650 makes contact with the channel 647, sealing the interface from the elements of the environment. It is to be appreciated that the plug may be configured from a variety of materials including, but not limited to, plastic, rubber, nylon, etc. In certain embodiments, the plug 644 will make a water-tight seal with the channel 647. The water-tight seal created could block out water, moisture, alternate liquids, dust, alternate solids, etc., and possibly keep the port, e.g., a USB port free of particles that could potentially damage the electronics described above.

Removal of the plug 644 involves lifting the cover 646 until the seal 652 disengages the channel 647. The cover 646 may now be rotated about the longitudinal axis of the leg portion 648 to exposed the port opening 642. It is to be appreciated that the step 654 of the leg portion 648 will retain the plug 644 to the bezel 649 thus preventing loss of the plug 644.

It is further to be appreciated that any of the ports described above may be arranged with the port opening 642 of the interface 640. Additionally, other ports may be employed, for example, an Ethernet port, a RS-232 port, a RS485 port, etc.

Figure 10:
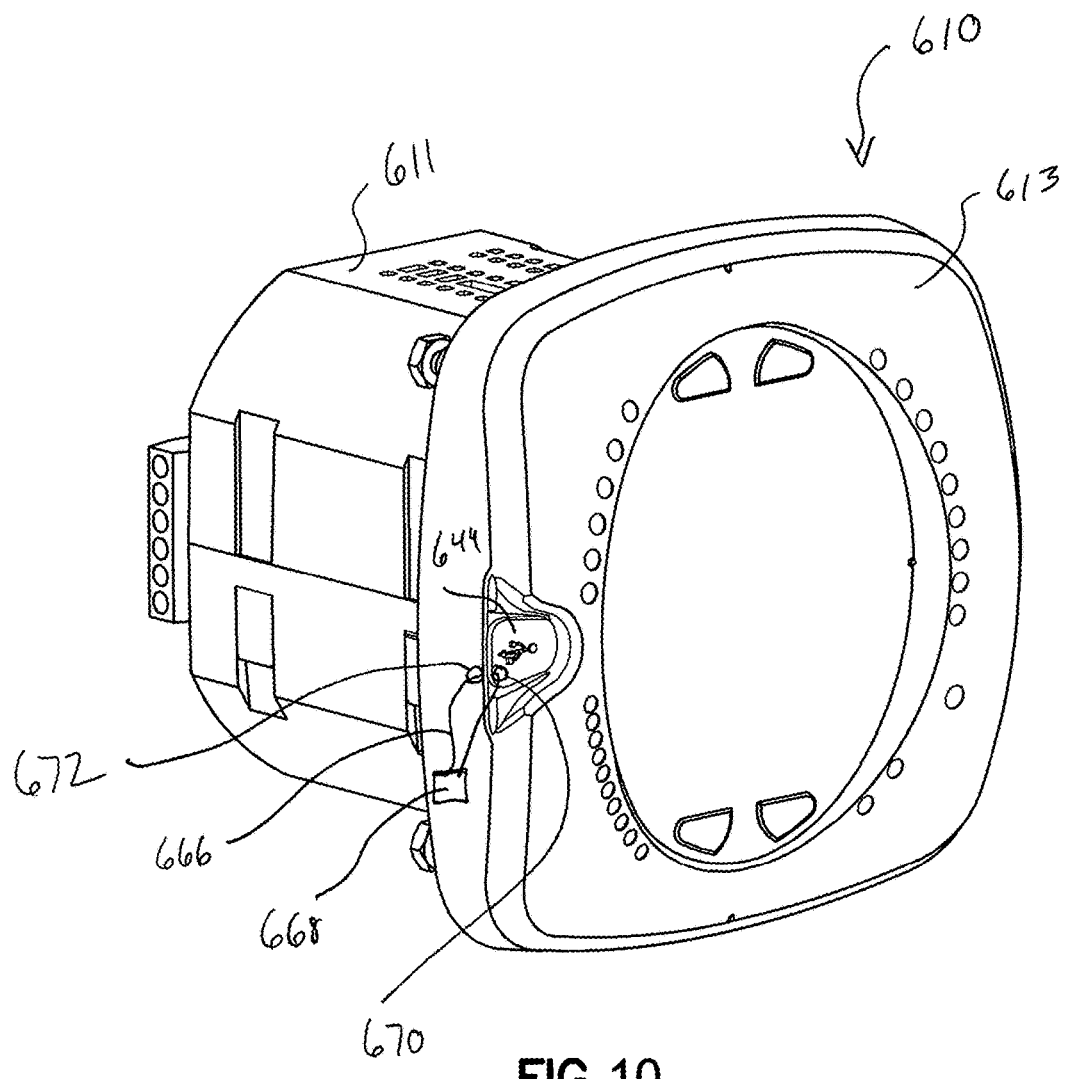
FIG. 10 illustrates a security mechanism of an intelligent electronic device in accordance with an embodiment of the present disclosure.

Furthermore, it is to be appreciated that the plug may be used to protect a port, a switch, a reset button, a demand reset or any other user accessible item on the face or around the body or housing of the IED. The plug may also have a mechanism to be locked as sealed using a meter seal, wire lock, pad lock or other type of lock that would enter through an opening and seal the plug to the instrument blocking removal. For example, referring to FIG. 10, the plug 644 includes an opening 670 and the face plate 613 includes a corresponding opening 672. When the plug 644 is in the appropriate position, a wire 666 may be passed through openings 670, 672 and secured with a seal 668 to prevent access to the interface 640.

Although the disclosure herein has been described with reference to particular illustrative embodiments, it is to be understood that these embodiments are merely illustrative of the principles and applications of the present disclosure. Therefore numerous modifications may be made to the illustrative embodiments and other arrangements may be devised without departing from the spirit and scope of the present disclosure, which is defined by the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . ." or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

What is claimed is:

1. An electronic meter comprising:
   a housing;
   at least one sensor configured for sensing at least one electrical parameter distributed to a load external from the housing;
   at least one analog-to-digital converter coupled to the at least one sensor and configured for converting an analog signal output from the at least one sensor to a digital data;
   at least one processing unit coupled to the at least one analog-to-digital converter configured to receive the digital data and store the digital data in a removable memory; and
   at least one device controller coupled to the at least one processing unit, the at least one device controller including at least one interface disposed on the housing for interfacing with the removable memory, wherein the at least one interface includes a communication port configured to receive the removable memory,
   wherein the housing includes an opening and a channel surrounding the opening, the communication port arranged within the opening of the housing, the opening configured to receive a plug, the plug including a cover having a lip portion surrounding a periphery of the cover and a seal extending from the lip portion, the seal configured to mate with the channel and the cover covers the opening when the plug is received by the opening to couple the plug to the at least one interface and protect the communication port from environmental conditions.

2. The electronic meter as in claim 1, wherein the opening includes a port opening portion arranged about the communication port and a circular opening portion, the circular opening portion configured for rotatably retaining the plug.

3. The electronic meter as in claim 2, wherein the plug further includes a leg portion extending perpendicularly from the cover, the leg portion being rotatably retained within the circular opening portion of the opening.

4. The electronic meter as in claim 3, wherein the leg portion includes a circular step configured to retain the plug in the circular opening portion, the circular step having a diameter greater than a diameter of the leg portion.

5. The electronic meter as in claim 2, further comprising a locking mechanism configured to prevent removal of the plug from the at least one interface.

6. The electronic meter as in claim 5, wherein the locking mechanism includes a seal to indicate tampering.

7. The electronic meter as in claim 1, wherein the communication port is at least one of a USB (Universal Serial Bus) port, an Ethernet port, an RS-232 port and/or an RS-485 port.

8. The electronic meter as in claim 1, wherein the housing further comprises a face plate including a display, the at least one interface being disposed on the face plate.

9. An electronic meter comprising:
   a housing;
   at least one sensor configured for sensing at least one electrical parameter distributed to a load external from the housing;
   at least one analog-to-digital converter coupled to the at least one sensor and configured for converting an analog signal output from the at least one sensor to a digital data;

at least one processing unit coupled to the at least one analog-to-digital converter configured to receive the digital data and store the digital data in a memory; and at least one interface accessible externally from the housing, the at least one interface includes a component coupled to the at least one processing unit and/or the memory, the component recessed within an opening on a surface of the housing, the opening includes a first opening portion arranged about the component and a second opening portion, the opening configured to receive a plug to prevent access to the component, wherein the plug includes a cover and a leg portion extending perpendicularly from the cover, the leg portion being rotatably retained within the second opening portion of the opening, the lea portion being configured to slide within the second opening portion toward or away from the housing to enable the cover to be pressed toward the housing such that the cover covers the first and second opening portions and to enable the cover to be drawn away from the housing to enable the cover to be rotated with respect to the housing to expose the first opening portion.

10. The electronic meter as in claim 9 further comprising a channel surrounding the opening, wherein the cover includes a lip portion a seal extending around the periphery of the cover and a seal extending from the lip portion, the seal configured to mate with the channel when the plug is received by the opening and the cover is pressed toward the housing.

11. The electronic meter as in claim 9, wherein the leg portion includes a circular step configured to retain the leg portion in the second opening portion, the circular step having a diameter greater than a diameter of the leg portion.

12. The electronic meter as in claim 9, further comprising a locking mechanism configured to prevent removal of the plug from the at least one interface.

13. The electronic meter as in claim 12, wherein the component is a switch.

14. The electronic meter as in claim 12, wherein the component is a reset button.

15. The electronic meter as in claim 12, wherein the component is a demand reset button.

16. The electronic meter as in claim 12, wherein the component is a user input.

17. An electronic panel meter comprising:
a housing;
at least one sensor configured for sensing at least one electrical parameter distributed to a load external from the housing;
at least one analog-to-digital converter coupled to the at least one sensor and configured for converting an analog signal output from the at least one sensor to a digital data;
at least one processing unit coupled to the at least one analog-to-digital converter configured to receive the digital data and store the digital data in a memory; and
a communication port coupled to the at least one processing unit, wherein the housing includes an opening and a channel surrounding the opening, the opening includes a first opening portion and a second opening portion, the communication port arranged within the first opening portion, the opening configured to receive a plug to protect the communication port from environmental conditions, wherein the plug includes a cover and a leg portion extending perpendicularly from the cover, the cover including a lip portion surrounding a periphery of the cover and a seal extending from the lip portion, the leg portion being rotatably retained within the second opening portion of the opening, the leg portion being configured to slide within the second opening portion toward or away from the housing to enable the cover to be pressed toward the housing such that the seal mates with the channel and the cover covers the first and second opening portions and to enable the cover to be drawn away from the housing to enable the cover to be rotated with respect to the housing to expose the first opening portion.

18. The electronic meter as in claim 9, wherein the component is a communication port.

19. The electronic meter as in claim 18, wherein the communication port is at least one of a USB (Universal Serial Bus) port, an Ethernet port, an RS-232 port and/or an RS-485 port.

20. The electronic meter as in claim 12, wherein the component is a communication port.

21. The electronic meter as in claim 20, wherein the communication port is at least one of a USB (Universal Serial Bus) port, an Ethernet port, an RS-232 port and/or an RS-485 port.

22. The electronic meter as in claim 9, wherein the component is at least one of a switch, a reset button, a demand reset button and/or a user input.

23. The electronic meter as in claim 12, wherein the locking mechanism includes a seal to indicate tampering.

24. The electronic meter as in claim 9, wherein the housing further comprises a face plate including a display, the at least one interface being disposed on the face plate.

* * * * *